(12) United States Patent
Okushima

(10) Patent No.: US 7,067,884 B2
(45) Date of Patent: Jun. 27, 2006

(54) ELECTROSTATIC DISCHARGE DEVICE

(75) Inventor: Mototsugu Okushima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/743,651

(22) Filed: Dec. 22, 2003

(65) Prior Publication Data

US 2004/0155291 A1  Aug. 12, 2004

(30) Foreign Application Priority Data

Dec. 24, 2002  (JP) ............................. 2002-373082

(51) Int. Cl.
*H01L 27/01* (2006.01)
*H01L 27/12* (2006.01)
*H01L 29/00* (2006.01)
*H01L 31/392* (2006.01)

(52) U.S. Cl. ..................... 257/355; 257/356; 257/357; 257/499; 257/501

(58) Field of Classification Search ........ 257/355–363, 257/509, 499–506
See application file for complete search history.

(56) References Cited

U.S. PATENT DOCUMENTS

| | | | |
|---|---|---|---|
| 5,181,091 A * | 1/1993 | Harrington et al. ......... | 257/355 |
| 5,321,293 A * | 6/1994 | Mojaradi et al. ............ | 257/369 |
| 5,326,994 A * | 7/1994 | Giebel et al. ................ | 257/174 |
| 5,652,456 A * | 7/1997 | Lien ............................ | 257/370 |
| 5,668,384 A * | 9/1997 | Murakami ................... | 257/106 |
| 5,670,814 A * | 9/1997 | Wu et al. .................... | 257/360 |
| 5,796,147 A * | 8/1998 | Ono ............................ | 257/355 |
| 5,986,863 A * | 11/1999 | Oh .............................. | 361/56 |
| 6,060,752 A * | 5/2000 | Williams .................... | 257/355 |
| 6,184,557 B1 * | 2/2001 | Poplevine et al. .......... | 257/358 |
| 6,281,554 B1 * | 8/2001 | Pan ............................. | 257/357 |
| 6,400,542 B1 * | 6/2002 | Lee et al. .................... | 361/56 |
| 6,576,934 B1 * | 6/2003 | Cheng et al. ............... | 257/107 |
| 6,788,507 B1 * | 9/2004 | Chen et al. .................. | 361/56 |
| 6,953,969 B1 * | 10/2005 | Nishikawa et al. ......... | 257/335 |
| 2002/0081783 A1 * | 6/2002 | Lee et al. .................... | 438/133 |

(Continued)

FOREIGN PATENT DOCUMENTS

JP  63-81845  4/1988

(Continued)

*Primary Examiner*—Jerome Jackson
*Assistant Examiner*—Jesse A. Fenty
(74) *Attorney, Agent, or Firm*—Muirhead & Saturnelli LLC

(57) ABSTRACT

M pieces of n-well regions nW are provided on a main surface of a p-type silicon substrate 3, and p-well regions pW are provided among the n-well regions adjacent to one another. Moreover, each of the M pieces of n-well regions nW includes an n-type diffusion region nD and a p-type diffusion region pD1, which are formed therein. Furthermore, the p-well region pW includes a p-type diffusion region pD2 therein. The n-type diffusion region nD in a j-th of the n-well region nW is connected to the p-type diffusion region pD1 in a (j+1)-th of the n-well region 10. The p-type diffusion region pD1 in the first n-well region nW is connected to a first terminal 1. The n-type diffusion region nD in the M-th of the n-well region nW is connected to a second terminal 2. In response to a potential relation between desired terminal to be protected (not depicted) and discharge terminal (not depicted) during a normal operation, the first terminal is connected to either one of the terminals, of which potential is higher, and the second terminal 2 is connected to the other of which potential is lower.

8 Claims, 20 Drawing Sheets

U.S. PATENT DOCUMENTS

2002/0145163 A1* 10/2002 Pan .......................... 257/355
2005/0280091 A1* 12/2005 Huang et al. ............... 257/355

FOREIGN PATENT DOCUMENTS

| JP | 2001-148460 | 5/2001 |
|----|-------------|--------|
| JP | 2002-43533  | 2/2002 |

* cited by examiner

INTERFACE CIRCUIT UNIT : INPUT BUFFER CIRCUIT,
OUTPUT BUFFER CIRCUIT AND THE LIKE

ELECTROSTATIC DISCHARGE DEVICE

BACKGROUND OF THE INVENTION

1. Field of the Invention

The present invention relates to an electrostatic discharge device which protects a semiconductor device (hereinafter, referred to as an LSI) from an electrostatic discharge (ESD), and particularly to an electrostatic discharge device which protects a device of which breakdown resistance is low such as a micro-transistor for use in operating the LSI at high speed.

2. Description of the Related Art

In recent years, as acceleration and integration of an LSI has been progressed significantly, miniaturization of a device, and particularly, thinning of a gate insulating film of a field-effect transistor (hereinafter, referred to as a MOSTr) has proceeded rapidly. Accordingly, it is necessary that an ESD protection circuit operate at a voltage lower than a voltage at which the gate insulating film of the MOSTr as a device to be protected is broken. In addition, in this case, in order to restrict an influence on high-speed operation performance of the LSI, it is necessary to restrict stray capacitance to be added by the ESD protection circuit to the device to be protected. In order to restrict the stray capacitance to be added, it is necessary to reduce a size of a protection device configuring the ESD protection circuit. However, when the size of the protection device is reduced, there is a problem that the protection device itself is prone to be damaged by ESD stress.

As a conventional example of an ESD protection circuit which can prevent a breakdown of the device to be protected and can also avoid the damage on the protection device itself, for example, there is a protection circuit disclosed in Japanese Patent Laid-Open Publication No. S63-81845 (published in 1988) (hereinafter, referred to as Patent Document 1). FIG. 1 depicts a diagram of the protection circuit disclosed in Patent Document 1.

Referring to FIG. 1, a protection circuit 600 disclosed in Patent Document 1 includes a first diode 604 and a first diode group 608 between an input terminal VIN 601 and a high potential side power supply terminal VDD 602, which are connected to a gate 606 of a field-effect transistor 607. The first diode 604 has an anode and cathode, which are connected to the input terminal VIN 601 and the power supply terminal VDD 602, respectively. The first diode group 608 includes a plurality of diodes connected in series so as to be directed to a forward direction from the power supply terminal VDD 602 side to the input terminal VIN 601 side.

Furthermore, the protection circuit 600 is configured by including a second diode 605 and a second diode group 609 between the input terminal VIN 601 and a low potential side power supply terminal VSS 603. The second diode 605 has an anode and cathode, which are connected to the power supply terminal VSS 603 and the input terminal VIN 601, respectively. The second diode group 609 has a plurality of diodes connected in series so as to be directed to a forward direction from the input terminal VIN 601 side to the power supply terminal VSS 603 side.

Moreover, as the conventional ESD protection circuit operating at the lower voltage for protecting the device of which ESD breakdown resistance is low, for example, there is an input protection circuit disclosed in Japanese Patent Laid-Open Publication No. 2001-148460 (Patent Document 2), or an ESD protection device disclosed in Japanese Patent Laid-Open Publication No. 2002-43533 (Patent Document 3).

FIG. 2A is a circuit diagram of the input protection circuit disclosed in Patent Document 2. FIG. 2B is a cross-sectional view schematically depicting a cross-sectional structure of the circuit in FIG. 2A. Referring to FIG. 2A, in an input protection circuit 700 disclosed in Patent Document 2, a drain (D) of an n-channel MOSTr (hereinafter, referred to as an NMOS) 711 is connected to an input terminal VIN, and a source (S) and gate (G) thereof are connected to each other, and these source (S) and gate (G) are connected to a ground (GND).

Meanwhile, a drain (D) of a p-channel MOSTr (hereinafter, referred to as a PMOS) 712 is connected to the input terminal VIN, and a source (S) and gate (G) thereof are connected to a power supply VDD in a state of being connected to each other. Between the power supply VDD and the input terminal VIN, (n3+n4) pieces of diodes 781 connected in series are inserted in a forward direction, and a connection point which divides these diodes 781 into the n3 pieces and the n4 pieces is connected to a substrate (SB) of the PMOS 712.

Furthermore, between the input terminal VIN and the GND, (n1+n2) pieces of diodes 781 connected in series are inserted in a forward direction, and a connection point which divides these diodes 781 into the n1 pieces and the n2 pieces is connected to a substrate (SB) of the NMOS 711.

Note that the number of diodes is determined in the following manner, for example, when the n1 and n2 pieces of diodes 781 are used. Specifically, when a power supply voltage is Vdd and an input voltage Vin to be applied to the input terminal VIN is $0 \leq Vin \leq Vdd$, if Vf is a forward voltage of one diode, the number of diodes is set to satisfy the following expression (1):

$$Vdd/(n1+n2) < Vf \qquad (1)$$

This setting is applied similarly to the n3 and n4 pieces of diodes 781. The expression (1) is a condition for restricting a leak current flowing through the diodes during a normal operation. During the normal operation, the voltage Vdd is applied to both ends of the (n1+n2) pieces of diodes 781 at the maximum, and accordingly, if the voltage Vdd/(n1+n2) distributed to the respective diodes is smaller as compared with the forward voltage Vf, then the leak will be restricted. For example, when the power supply voltage is 3.3V, if the forward voltage Vf is set at 0.33V, a relation: n1+n2>10 (=3.3/0.33) is established because Vdd/Vf<n1+n2 is derived from the expression (1).

Hence, n1 is set at 10, and n2 is set at 1. In this case, the input voltage Vin during the normal operation is present between 0V and 3.3V, a potential on the connection point of the n1 piece of diodes 781 and the n2 piece of diode 781, that is, a substrate potential (SB potential) of the NMOS 711 is changed between 0V and 0.3V which are distributed among the n1+n2 pieces of diodes 781.

With such a configuration, the substrate (SB) of the PMOS 712 or NMOS 711 is biased in response to the input voltage Vin applied to the input terminal VIN. Hence, a snapback trigger voltage Vt1 of the MOSTr on the substrate (SB) which is biased in the forward direction can be lowered, thus making it possible to prevent a gate oxide film of an internal device from being broken by an overvoltage input.

Note that FIG. 2B depicts a cross-sectional structure of the input protection circuit depicted in FIG. 2A. Here, between a circuit portion composed of the NMOS 711 and the n1 and n2 pieces of diodes 781 and a circuit portion composed of the PMOS 712 and the n3 and n4 pieces of diodes 781, only different are conduction types of impurities of the MOSTr portions and the biases therefor. Structures and operations other than the above are in a symmetrical relation and basically the same. Therefore, FIG. 2B only depicts the NMOS 711 and a circuit relating thereto.

FIGS. 3A and 3B are constitutional diagrams of an ESD protection device by the inventor of the present invention. Specifically, FIG. 3A is a circuit diagram of an ESD protection device disclosed in Japanese Patent Laid-Open Publication No. 2002-43533 (Patent Document 3). FIG. 3B is a cross-sectional view schematically depicting a cross-sectional structure of the circuit in FIG. 3A. This ESD protection device 800 operates as an input buffer protection circuit.

Referring to FIG. 3A, this ESD protection device 800 is provided between an input terminal (input pad) 806 of a semiconductor integrated circuit chip and, for example, a CMOS (Complementary Metal Oxide Semiconductor) transistor 880. Furthermore, the ESD protection device 800 includes: a trigger device 850 having diode groups 851 and 852 which conduct by an overvoltage applied to the input terminal 806; and an ESD protection device 820 having vertical bipolar transistors 821 and 822 which conduct by the conduction of the diode groups 851 and 852 and discharge electric charges accumulated in the input terminal 806.

Then, each of the diode groups 851 and 852 has a plurality of diodes connected in series. The overvoltage is a forward voltage for the diode groups 851 and 852.

Note that, with regard to each of the diode groups 851 and 852, FIG. 3A depicts four diodes connected in series. FIG. 3B depicts two diodes connected in series in a simplifying manner for the sake of convenience.

In the diode group 851, a cathode of a first diode is connected to a base of the vertical bipolar transistor 821, and an anode of a last diode is connected to the input terminal 806. In the diode group 852, a cathode of a last diode is connected to a base of the vertical bipolar transistor 822, and an anode of a first diode is connected to a power supply terminal 807. A resistor 833 is connected between the cathode of the first diode of the diode group 851 and a ground terminal 808. A resistor 834 is connected between the cathode of the last diode of the diode group 852 and the input terminal 806.

Both of the vertical bipolar transistors 821 and 822 are of an NPN type. In the vertical bipolar transistor 821, a collector is connected to the input terminal 806, and an emitter is connected to the ground terminal 808. In the vertical bipolar transistor 822, a collector is connected to the power supply terminal 807, and an emitter is connected to the input terminal 806. The resistors 833 and 834 are made of single crystal silicon, polycrystalline silicon, metal or the like, which is formed in the same semiconductor integrated circuit chip. Each of the diode groups 851 and 852 is formed of an N+ diffusion layer 801, a P+ diffusion layer 802, an N-well 805 and the like, which are formed during a normal CMOS process.

This ESD protection device raises base potentials of the vertical bipolar transistors 821 and 822 by a voltage drop when a trigger current caused by the conduction of the diode groups 851 and 852 flows through the resistors 833 and 834, thus turning on the vertical bipolar transistors 821 and 822. In such a way, a large amount of electric charges accumulated electrostatically in the input terminal 806 is discharged in a vertical direction of a silicon substrate, and a large ESD resistance is obtained.

The protection circuit disclosed in Patent Document 1 uses the diode groups in which a plurality of diodes is connected in series. Then, the ESD stress applied to a terminal to be protected is discharged to a discharge terminal of a high potential side power supply terminal, a low potential side power supply terminal or the like by the forward current of the diodes. Therefore, the damage to the protection device can be prevented.

Consequently, an ON resistance in the forward direction when the plurality of diodes are connected in series is increased fairly much, and accompanied with an increase of the discharge current, a potential difference between the terminal to be protected and the discharge terminal is increased radically. Therefore, it is problematic that the protection circuit is applied to the protection of the recent device in which the ESD resistance is low.

As one of means for solving this problem, it is conceived that an electrostatic discharge device is configured such that another current path is formed parallel to the diode groups.

As an example of the above, FIGS. 4A and 4B are views depicting an example where the diodes configuring the diode groups are arranged to be proximate to one another and a parasitic effect when the forward current is flown through the diode groups is used.

FIG. 4A is a schematic plan view. FIG. 4B is a schematic cross-sectional view depicting a cross section on arrow along a line R–R' of FIG. 4A.

Referring to FIG. 4A, an electrostatic discharge device 900 includes: n-well regions 910, 920 and 930, all of which are formed on a main surface of a p-type silicon substrate 903; and a p-well region 940 surrounding the whole of these. Furthermore, in an inside of the n-well region 910, an n-type diffusion region 911 and a p-type diffusion region 915 are formed. In an inside of the n-well region 920, an n-type diffusion region 921 and a p-type diffusion region 925 are formed. In an inside of the n-well region 930, an n-type diffusion region 931 and a p-type diffusion region 935 are formed. In an inside of the p-well region 940, a p-type diffusion region 945 is formed.

Then, what are connected to each other are: the p-type diffusion region 915 and a first terminal 901; the n-type diffusion region 911 and the p-type diffusion region 925; the n-type diffusion region 921 and the p-type diffusion region 935; and the n-type diffusion region 931 and a second terminal 902. Hence, this electrostatic discharge device 900 has a configuration in which a first diode D1 formed of the n-well region 910 and the p-type diffusion region 915, a second diode D2 formed of then-well region 920 and the p-type diffusion region 925, and a third diode D3 formed of the n-well region 930 and the p-type diffusion region 935 are connected in series in the forward direction between the first terminal 901 and the second terminal 902. Note that the p-type diffusion region 945 is usually connected to a lowest potential power supply of an LSI on which this electrostatic discharge device 900 is mounted.

The inventor of the present invention has recognized that, as in the input protection circuit of Patent Document 2 and the ESD protection device of Patent Document 3, there is a method for using the diode groups as trigger devices, in which the diode groups are provided parallel to the ESD protection device. Specifically, in each of the input protection circuit of Patent Document 2 and the ESD protection device of Patent Document 3, the diode groups formed by interconnecting the forward diodes on multiple stages are inserted between the terminal to be protected and the discharge terminal, parallel to the ESD protection device, so as to obtain the power supply voltage or more. Then, each of the input protection circuit and the ESD protection device uses the diode groups as the trigger devices of the ESD protection device to allow the diode groups to perform a protection operation at a low voltage, thus avoiding the problem of the forward ON resistance of the diodes (discharge capability).

However, in such a configuration, there is a problem that the ESD protection device is required besides the diode groups to cause an increase of an area required for the ESD protection circuit. Moreover, as depicted in FIGS. 2B and 3B, these diode groups are arranged without undergoing such treatments as changing concentrations of p-type impurities among the N-wells 791 (FIG. 2B) in the diodes proximate and adjacent to one another on the p-type substrate and changing concentrations of p-type impurities between the N-wells 805 in FIG. 3B.

Hence, it is an object of the present invention to provide an electrostatic discharge device capable of performing, at a low voltage, a protection operation for a device to be protected, thereby being capable of protecting the device to be protected, of which ESD resistance is small, from ESD as well as controlling stray capacitance to be added to the device.

SUMMARY OF THE INVENTION

An electrostatic discharge device of the present invention includes: M pieces (M is an integer of two or more) of first well regions formed on a main surface of a semiconductor substrate of one conduction type, the first well regions being of a conduction type reverse thereto; and a second well region of the one conduction type, the second well region being formed between the first well regions adjacent to each other. Moreover, each of the M pieces of first well regions includes a first diffusion region of the reverse conduction type, and a second diffusion region of the one conduction type, both of which are formed therein. In addition, at least one of a plurality of the second well regions includes a third diffusion region of the one conduction type, which is formed therein. The first diffusion region in a j-th (j is an integer that satisfies: 1<j<(M−1)) of the first well region is connected to the second diffusion region in a (j+1)-th of the first well region. The second diffusion region in the first well region at the first position is connected to a first terminal. The first diffusion region in an M-th of the first well region is connected to a second terminal. Then, the first terminal is connected to either one of desired terminal to be protected and discharge terminal, and the second terminal is connected to the other.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First, an embodiment of a semiconductor device(a electrostatic discharge device) of the present invention will be described in detail with reference to the drawings.

First Embodiment

Figure 6A:
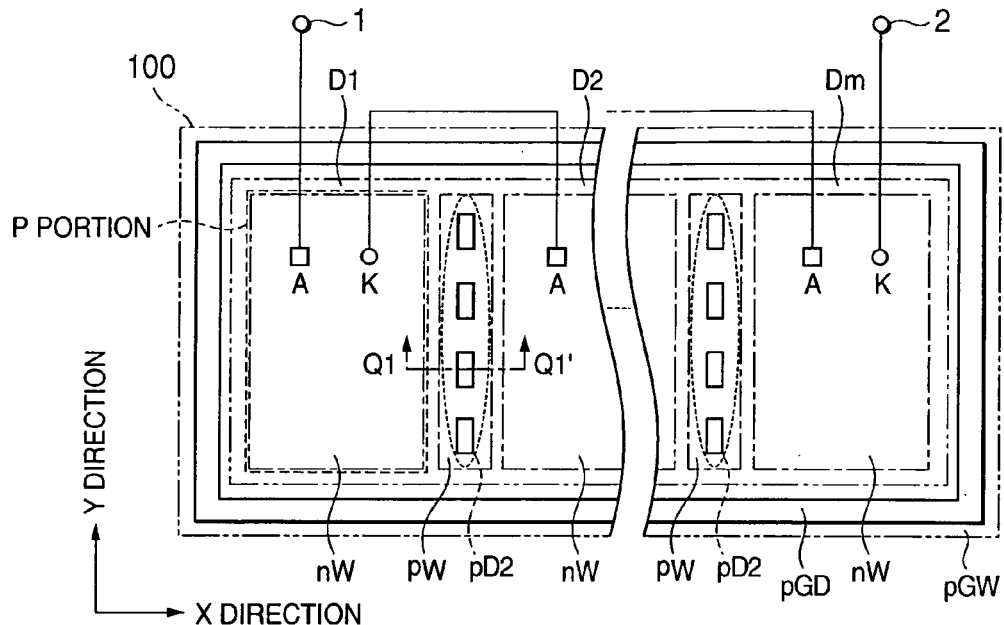
FIG. 6A is a plan view schematically depicting an embodiment of an electrostatic discharge device of the present invention.
Figure 6B:
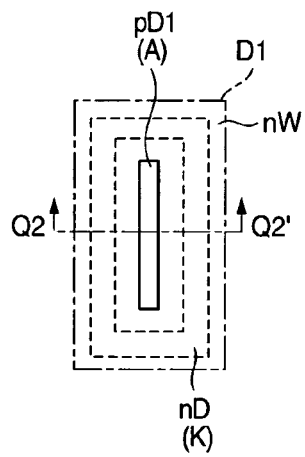
FIG. 6B is a detailed plan view schematically depicting a portion P in FIG. 6A.
Figure 6C:
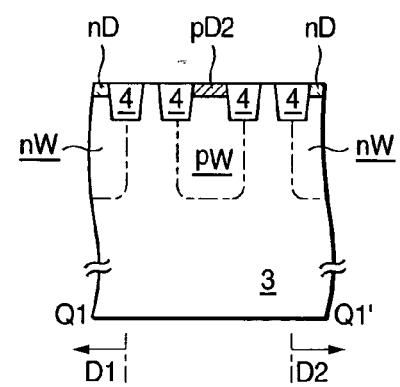
FIGS. 6C and 6D are cross-sectional views schematically depicting a cross section on arrow along a line Q1–Q1' in FIG. 6A and a cross section on arrow along a line Q2–Q2' in FIG. 6B, respectively.
Figure 6D:
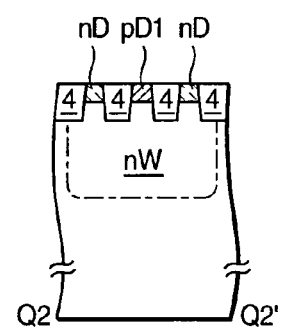
Figure 6E:
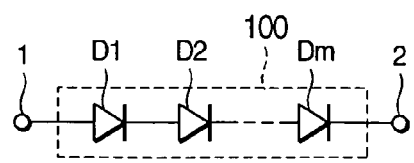
FIG. 6E depicts a schematic equivalent circuit diagram of FIG. 6A.

FIGS. 6A to 6E are views depicting a first embodiment of an electrostatic discharge device of the present invention. FIG. 6A is a schematic plan view. FIG. 6B is a detailed plan view schematically depicting a portion P in FIG. 6A. FIG. 6C is a cross-sectional view schematically depicting a cross section on arrow along a line Q1–Q1' in FIG. 6A. FIG. 6D is a cross-sectional view schematically depicting a cross section on arrow along a line Q2–Q2' in FIG. 6B. FIG. 6E is a schematic equivalent circuit diagram of FIG. 6A.

Note that description will be made below on the assumption that a semiconductor substrate is a silicon substrate, that one conduction type is a p type, and that a conduction type reverse thereto is an n type. Moreover, it is assumed that an impurity concentration of a diffusion region is sufficiently higher than that of a well region in the case of the same conduction type.

Referring to FIGS. 6A to 6E, two directions orthogonal to each other on a main surface of a p-type silicon substrate 3 that is the semiconductor substrate of the one conduction type are defined as an X direction and a Y direction. Devices are formed on the main surface. In this case, for example, an electrostatic discharge device 100 of the first embodiment of the present invention includes n-well regions nW that are M pieces (M is an integer of two or more) of first well regions of the reverse conduction type, which are arranged/formed so as to be spaced from one another along a straight line in the X direction, and p-well regions pW that are second well regions of the one conduction type, which are formed among the n-well regions, nW adjacent to one another.

Furthermore, in the electrostatic discharge device 100 of the first embodiment of the present invention, each of the M pieces of n-well regions nW includes an n-type diffusion region nD that is a first diffusion region of the reverse conduction type, and a p-type diffusion region pD1 that is a second diffusion region of the one conduction type, both of which are formed in an inside of the n-well region nW. Moreover, each of the p-well regions pW includes p-type diffusion regions pD2 that are third diffusion regions of the one conduction type, which are formed in an inside thereof.

Then, in the electrostatic discharge device 100 of the first embodiment of the present invention, an n-type diffusion region nD in a j-th (j is an integer that satisfies: $1 \leq j \leq (M-1)$) n-well region nW is connected to a p-type diffusion region pD1 in a (j+1)-th n-well region 10. A p-type diffusion region pD1 in a first n-well region nW is connected to a first terminal 1. An n-type diffusion region nD in an M-th n-well region nW is connected to a second terminal 2. Either one of the first terminal 1 and the second terminal 2 are connected to either one of desired terminal to be protected and discharge terminal (both are not depicted), and the other one of the terminals 1 and 2 is connected to the other. This connection order is exchangeable. Moreover, in the electrostatic discharge device 100 of the first embodiment of the present invention, the plurality of p-type diffusion regions pD2 are formed in the one p-well region pW so as to be spaced from one another.

Note that, in order to avoid mutual interference with other devices, usually, the electrostatic discharge device 100 of the first embodiment of the present invention further includes a p-well region pGW entirely surrounding the M pieces of n-well regions nW, and a p-type diffusion region pGD formed therein. The p-type diffusion region pGD is connected to a lowest potential power supply VSS of an LSI in question.

With such a configuration as described above, in the electrostatic discharge device 100 of the first embodiment of the present invention, the n-type diffusion region nD and the p-type diffusion region pD1, which are formed in the inside of each of the n-well regions nW, are made to function as a cathode and an anode, respectively. Thus, a diode is configured. An equivalent circuit becomes as depicted in FIG. 6E. Specifically, a cathode (K) of a j-th (j is an integer that satisfies: $1 \leq j \leq (M-1)$) diode Dj is connected to an anode (A) of a (j+1)-th diode D(j+1), an anode of a first diode D1 is connected to the first terminal 1, and a cathode of an M-th diode Dm is connected to the second terminal 2.

Here, a method for setting the number M will be described. Basically, the minimum one among integers N that satisfy the following expression may be selected as the number M:

$$|Vx| < N \times |Vf|$$

where Vf is a forward voltage when a forward current If0 is flown through the diode formed of the n-well regions nW, the forward current If0 being a leak current allowable between the terminal to be protected and the discharge terminal, to which the electrostatic discharge device 100 is connected, and Vx is the maximum potential difference that occurs between the terminal to be protected and the discharge terminal during a normal operation.

In such a way, the forward voltage to be applied to each diode becomes less than Vf. Therefore, a leak current exceeding a predetermined rated value is not flown even if the electrostatic discharge device 100 is connected, thus making it possible to prevent an increase of wasteful power consumption.

Moreover, in the electrostatic discharge device 100 of the first embodiment of the present invention, the p-well regions pW are provided among the n-well regions nW adjacent to one another. In each of the p-well regions pW, the plurality of p-type diffusion regions pD2 spaced from one another are provided. Hence, when a potential difference between each pair of the adjacent n-well regions nW is increased to some extent, a parasitic NPNTr formed of the adjacent n-well regions nW and the p-type silicon substrate 3 is turned on, and a current path is formed. That is, a parasitic vertical PNP bipolar transistor which is formed of an emitter 31, a base 30 and a collector 3 operates in an active state (referring FIG. 9B). A collector current of the parasitic vertical PNP bipolar transistor flows through the p-type silicon substrate. As a result, a parasitic lateral NPN bipolar transistor which is formed of an emitter 30, a base 3 and a collector 20 operates in an active state.

Figure 5:
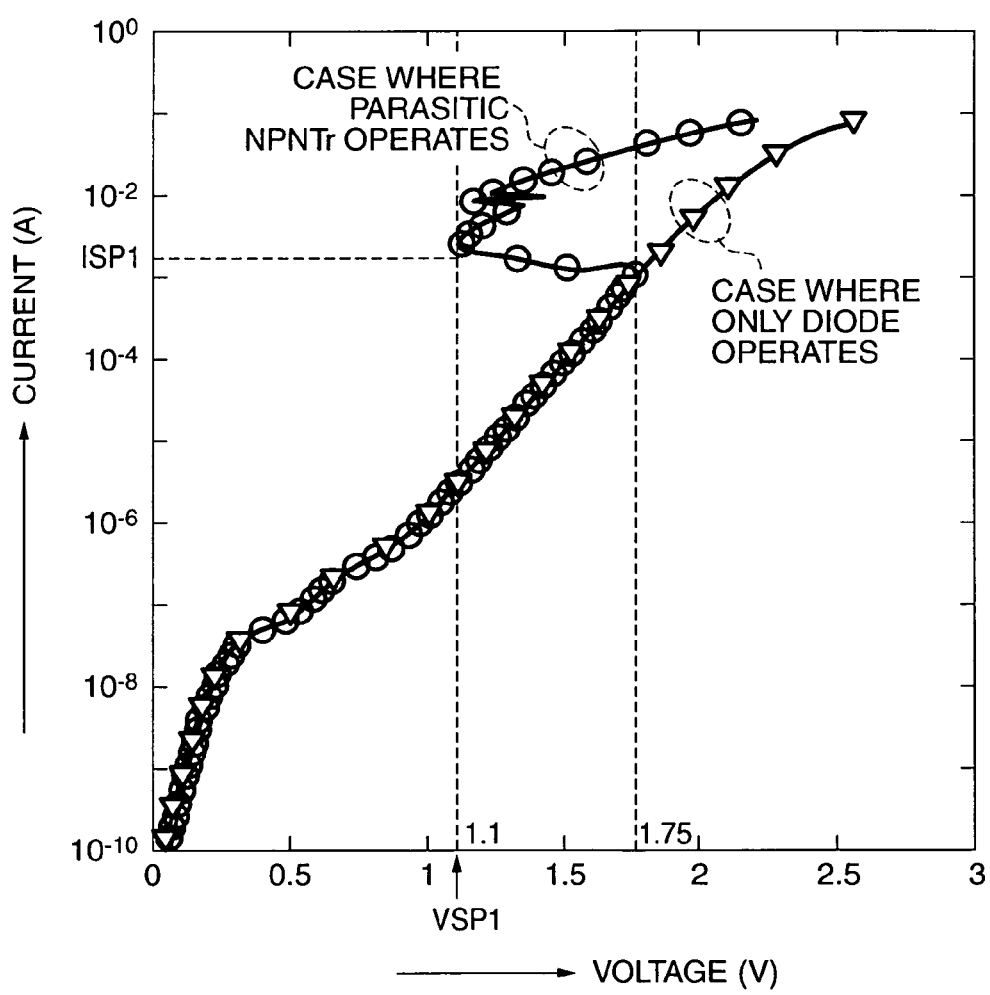
FIG. 5 is a graph depicting voltage-current characteristics of an electrostatic discharge device of FIG. 4A together with voltage-current characteristics in a case of only a group of diodes connected in series in a forward direction.

Voltage-current characteristics when noise that makes the first terminal 901 side positive is applied between the first terminal 901 and the second terminal 902 of this electrostatic discharge device 900 are represented as a graph of "a case where a parasitic NPNTr operates" depicted in FIG. 5.

Specifically, as for a discharge path in this case, first, a discharge is only performed to the second terminal 902 through the three first to third diodes D1 to D3 connected in series. Then, when a voltage between the first terminal 901 and the second terminal 902 rises to some extent (to approximately 1.75V in this example), a parasitic NPN transistor (hereinafter, referred to as a parasitic NPNTr) 991 composed of the n-well region 910, the n-well region 920 and the p-type silicon substrate 903 is turned on, and a parasitic NPNTr 993 composed of the n-well region 920, the n-well region 930 and the p-type silicon substrate 903 is turned on. It is noted that the voltage to approximately 1.1V in this example in FIG. 5, is called as "a holding voltage". In such a way, a discharge path is formed parallel to the diode groups. The voltage rise between both of the terminals is controlled.

The inventor of the present invention has recognized that, in this electrostatic discharge device 900, when a protection operation occurs due to the noise, the holding voltage at which a latch-up occurs between the first terminal 901 and the second terminal 902 and a holding voltage for the latch-up are extremely low (in this example, approximately 1.75V and 1.1V, respectively) as understood from FIG. 5, so that the electrostatic discharge device 900 cannot be applied to an LSI in which a power supply voltage during a normal operation is approximately 1V or more.

Specifically, there is also a problem that the latch-up is prone to occur due to the noise applied to the input terminal VIN in a similar way to the electrostatic discharge device 900.

Then, as compared with a holding voltage of an electrostatic discharge device in the case where only the p-type silicon substrate 3 or only the p-well region pw is present between the adjacent n-well regions nW, a holding voltage of the electrostatic discharge device 100 of the first embodiment of the present invention is increased.

Figure 7A:
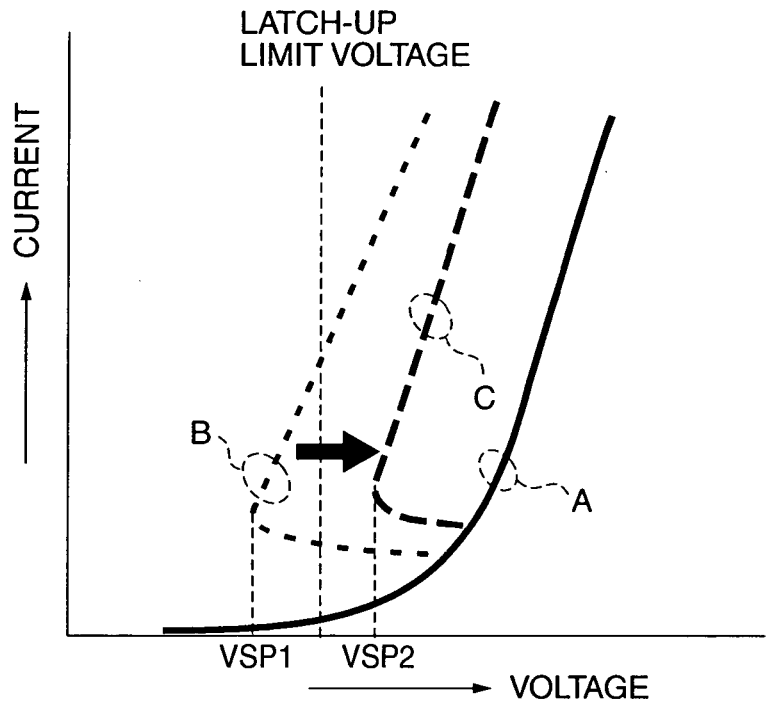
FIGS. 7A and 7B depict schematic graphs of voltage-current characteristics of electrostatic discharge devices.
Figure 7B:
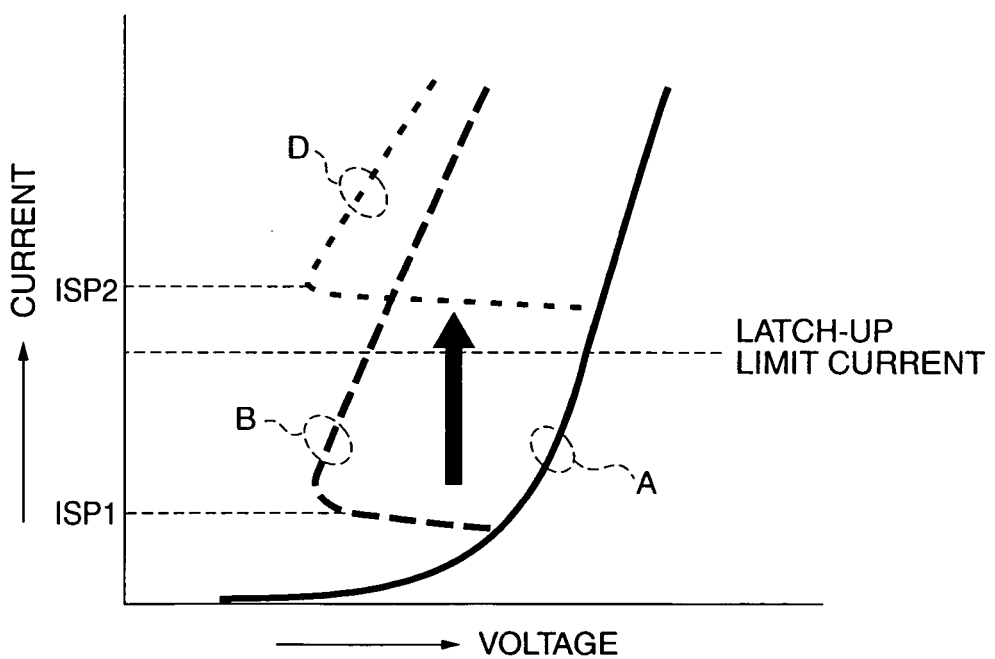

FIGS. 7A and 7B are schematic graphs of voltage-current characteristics of electrostatic discharge devices, which explain a state of the above.

Lines A are lines corresponding to the case where a guard ring is provided around each p-type diffusion region PD2 which are formed in each n-well region and connected to the low potential power supply VSS. Lines B are lines corresponding to the case where only the p-type silicon substrate 3 or only the p-well region pW is present and p-type diffusion region PD2 is absent between the adjacent n-well regions nW. Lines C and D are lines corresponding to the case where, between the adjacent n-well regions nW, the p-well region pW is provided and the p-type diffusion regions pD2 are partially provided. Note that the holding voltage VSP1 exists on Lines B and the holding voltage VSP2 exists on Lines C in FIG. 7A.

Specifically, the lines A correspond to the case where ESD stress is discharged by a forward current of a group of diodes connected in series. The lines B to D correspond to the case where the ESD stress is discharged by the forward current of the group of diodes connected in series and through a current path formed by the parasitic NPN bipolar transistor effect.

Moreover, in the case of line B, when the latch-up occurs due to the noise, both of latch-up holding voltage and current become less than limit voltage and current. Then, even if the noise disappears, such a latch-up phenomenon is not resolved, and the LSI cannot return to the normal operation. Furthermore, because the holding voltage VSP1 is smaller than the voltage limiting a latch-up phenomenon, a latch-up resistance is small. Specifically, the latch-up is prone to occur due to the noise during the normal operation, and the operation becomes unstable. Note that the limit voltage and current described above refer to the maximum rated voltage and current applicable to the LSI.

However, in the lines C and D corresponding to the configuration of the electrostatic discharge device 100 of the first embodiment of the present invention, when the ESD stress is increased to some extent, as described above, the parasitic NPNTr formed of the adjacent n-well regions nW and the p-type silicon substrate 3 is turned on, the current path is formed parallel to the diode group. Therefore, discharge current capability can be achieved without destruction of internal device due to controlling the rise of voltage between the first terminal 1 and the second terminal 2 in FIG. 6E.

Then, the p-well region pW and the p-type diffusion regions pD2 provided therein are provided between the adjacent n-well regions nW. Therefore, at least any one of the following conditions is satisfied: where "the holding voltage during the latch-up operation is larger than the limit voltage" as in FIG. 7A; and where "a latch-up operation starting current is larger than the limit current" as in FIG. 7B. Consequently, no latch-up occurs during the normal operation, and stability of the operation is improved.

Note that the starting current (ISP1) and the hold voltage (VSP1) of the parasitic lateral NPN bipolar transistor can be controlled by changing the dimension of the p-well region pW and the dimension of the p-type diffusion regions pD2 formed between the adjacent n-well regions nW.

Figure 10A:
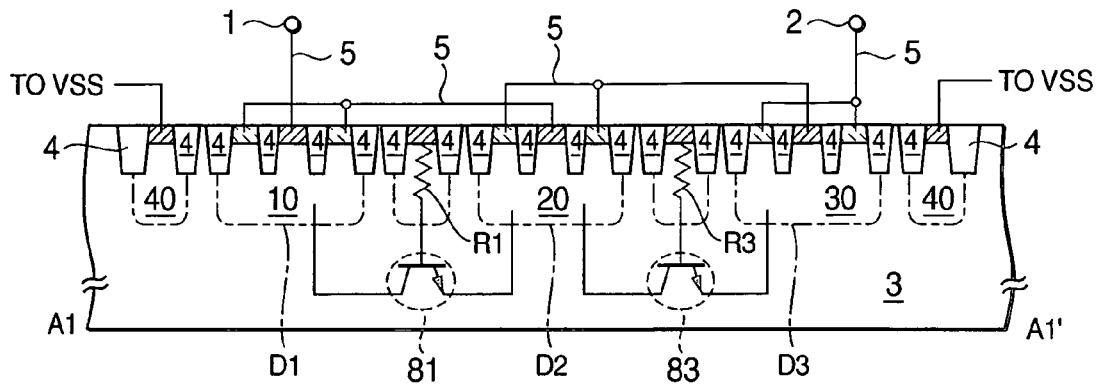
FIGS. 10A and 10B are a diagram depicting an equivalent circuit of the electrostatic discharge device of the first embodiment, and the like, and are a view depicting the cross-sectional view of FIG. 9B, to which schematic parasitic devices are added, and an equivalent circuit diagram including a parasitic effect, respectively.

In FIG. 10A, a vertical base resistance (R1, R3) can be controlled by area of pW and PD2, and Y direction base resistance along the edge PGW of a parasitic lateral NPN transistor (81, 83) can be controlled by shapes of pW and PD2 because of lower sheet resistance of pW and PD2 compared with regions without p-type implantation. Thus, the raising of base potential which is produced by the collector current of the parasitic PNP transistor can be controlled.

Therefore, it is satisfactory that the areas, shapes, impurity concentrations and the like of the p-well region pW and p-type diffusion regions pD2 formed therein may be determined as appropriate in response to the above-described limit voltage value or current value of the terminals, to which the electrostatic discharge device 100 of this embodiment is connected.

Figure 8A:
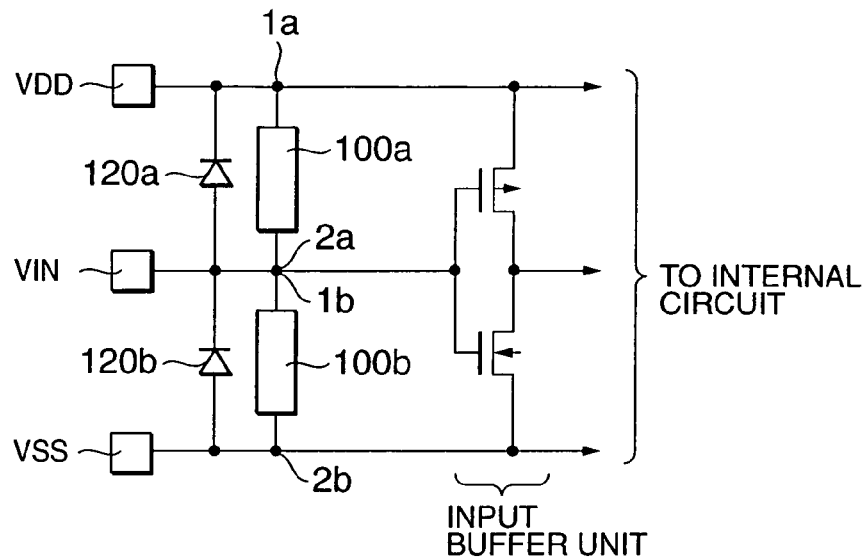
FIGS. 8A, 8B and 8C are connection diagrams depicting concrete examples where the electrostatic discharge device of FIGS. 6A to 6E is applied to an LSI, depicting connection examples in the case where the electrostatic discharge device 100 is applied to protections of an input, an output and a power supply, respectively.
Figure 8B:
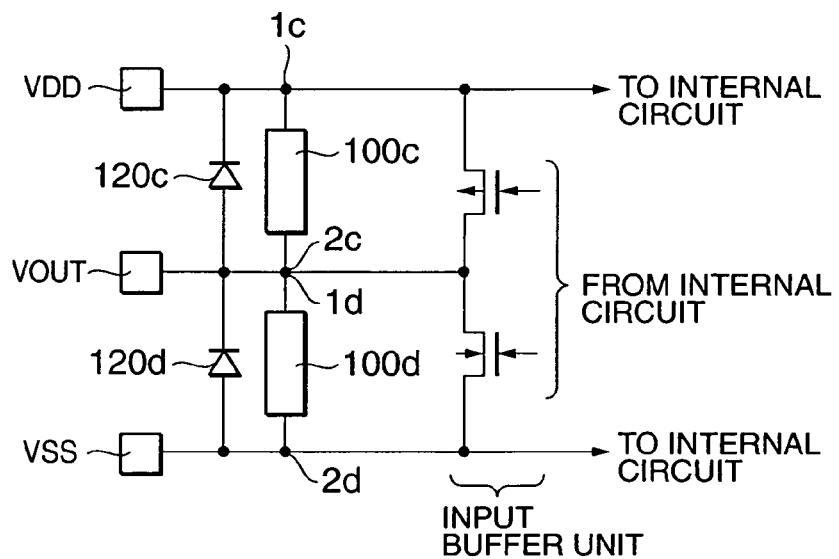
Figure 8C:
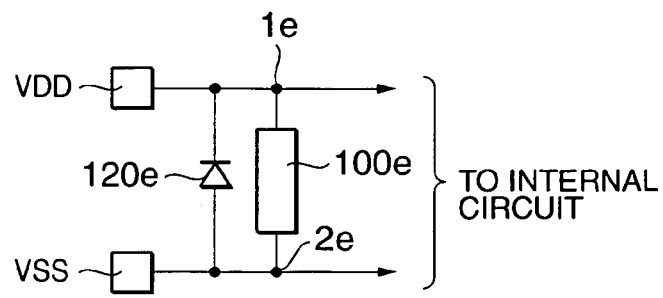

FIGS. 8A to 8C are connection diagrams depicting concrete examples where the electrostatic discharge device 100 of this embodiment is applied to the LSI. FIG. 8A depicts a connection xample in the case where the electrostatic discharge device 100 is applied to protection of an input. FIG. 8B depicts a connection example in the case where the electrostatic discharge device 100 is applied to protection of an output. FIG. 8C depicts a connection example in the case where the electrostatic discharge device 100 is applied to protection of a power supply.

Description will be made, for example, for the case where the electrostatic discharge device 100 is applied as an input protection device.

Referring to FIG. 8A, an electrostatic protection device 100a and an electrostatic protection diode 120a are connected between an input terminal VIN that is the terminal to be protected and a high potential power supply VDD that is the discharge terminal. In this case, the connection is made such that both of a first terminal 1a of the electrostatic protection device 100a and a cathode of the electrostatic protection diode 120a are directed to the high potential power supply VDD side.

Furthermore, an electrostatic protection device 100b and an electrostatic protection diode 120b are connected between the input terminal VIN that is the terminal to be protected and a low potential power supply VSS that is the discharge terminal. In this case, the connection is made such that both of a second terminal 2b of the electrostatic protection device 100b and an anode of the electrostatic protection diode 120b are directed to the low potential power supply VSS side.

Next, description will be made for the case where the electrostatic discharge device 100 is applied as an output protection device. Referring to FIG. 8B, an electrostatic protection device 100c and an electrostatic discharge diode 120c are connected between an output terminal VOUT that is the terminal to be protected and a high potential power supply VDD that is the discharge terminal. In this case, the connection is made such that both of a first terminal 1c of the electrostatic protection device 100c and a cathode of the electrostatic protection diode 120c are directed to the high potential power supply VDD side. Furthermore, an electrostatic protection device 100d and an electrostatic protection diode 120d are connected between the output terminal VOUT that is the terminal to be protected and a low potential power supply VSS that is the discharge terminal. In this case, the connection is made such that both of a second terminal 2d of the electrostatic protection device 100d and an anode of the electrostatic protection diode 120d are directed to the low potential power supply VSS side. However, the electrostatic protection diodes 120c and 120d can be omitted.

Next, description will be made for the case where the electrostatic discharge device 100 is applied as a power supply protection device. Referring to FIG. 8c, an electrostatic protection device 100e and an electrostatic protection diode 120e are connected between a high potential power supply VDD and a low potential power supply VSS. In this case, the connection is made such that both of a first terminal 1e of the electrostatic protection device 100e and a cathode of the electrostatic protection diode 120e are directed to the high potential power supply VDD side. Then, both of a second terminal 2e of the electrostatic protection device 100e and an anode of the electrostatic protection diode 120e are connected to the low potential power supply VSS side. However, the electrostatic protection diode 120e can be omitted. Note that, in this case of the protection of the power supply, the terminal to which the ESD stress is applied becomes the terminal to be protected, and the other becomes the discharge terminal.

Among them, the method for setting the number M will be concretely described by taking the case of the input protection as an example. Note that the description will be made on the following assumptions: both of the maximum leak currents allowable for the electrostatic protection devices 100a and 100b connected between the input terminal VIN and the high potential power supply VDD and between the input terminal VIN and the low potential power supply VSS, respectively, are If0; the forward voltage of one diode when the forward current If0 is flown through the respective diodes configuring the electrostatic discharge device is all Vf; and the potential of the low potential power supply VSS is, for example, a ground potential, that is, 0V. The maximum potential difference Vxh between the input terminal VIN and the high potential power supply VDD and the maximum potential difference Vxs between the input terminal VIN and the low potential power supply VSS during the normal operation are obtained in the following manner, respectively:

$$Vxh = Vdd\text{max} - Vin\text{min}$$

$$Vxs = Vin\text{max} - VSS$$

where the maximum and minimum voltages to be applied to the input terminal VIN during the normal operation are Vinmax and Vinmin, respectively, and the maximum operation voltage recommended for the high potential power supply VDD is Vddmax.

Hence, the numbers Ma and Mb of n-well regions (hence, the number of diodes) configuring the electrostatic protection devices 100a and 100b may satisfactorily be set at the minimum values of integers Na and Nb satisfying the following expressions, respectively:

$$|Vxh| < Na \times |Vf|$$

$$|Vxs| < Nb \times |Vf|$$

For example, if the LSI is formed of CMOS, the following equations are established in many cases:

$$Vin\text{max} = Vdd\text{max}.$$

$$Vin\text{min} = 0$$

When the LSI is operated at high speed, settings are sometimes made to satisfy the following expressions:

$$0 < Vin\text{min}, Vin\text{max} < Vdd\text{max}$$

In this case, there is a possibility that the numbers of n-well regions nW, that is, the numbers of diodes can be reduced more than that of the electrostatic discharge device for the protection of the power supply.

FIGS. 8A to 8C depict the examples where the electrostatic discharge diodes 120 are connected between the terminal to be protected and the discharge terminal so as to be parallel to the electrostatic discharge devices 100 in a direction reverse thereto. However, in such a case where it is necessary for the LSI to be ready for hot swap or hot plug, the potentials of the input terminal VIN and output terminal VOUT sometimes become higher than the potential of the high potential power supply VDD. Therefore, the electrostatic protection diode 120a or 120c cannot be used.

Figure 19:
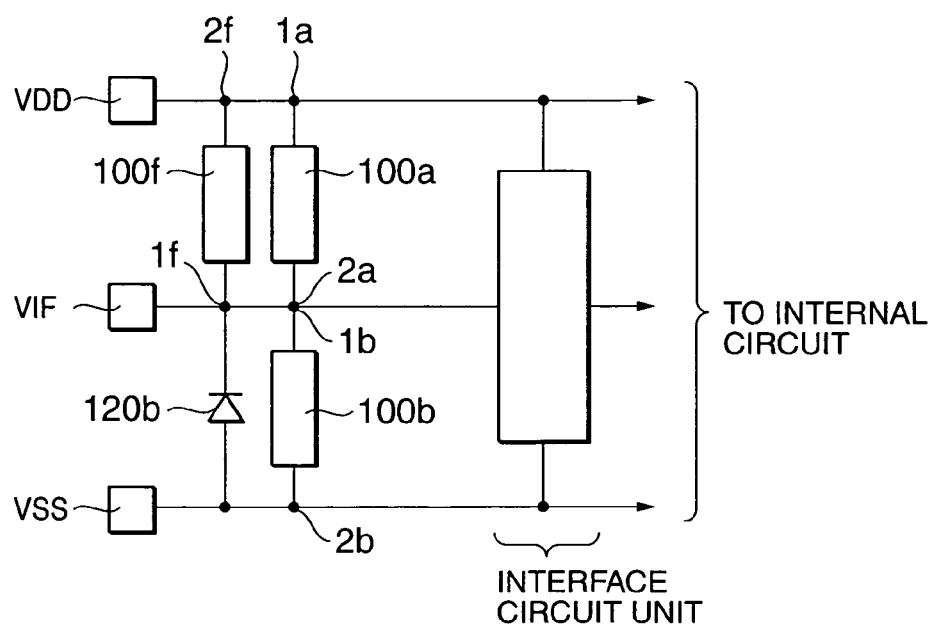
FIG. 19 is a connection diagram depicting a concrete example where the electrostatic discharge device of FIG. 6 is applied to the LSI.

In this case, as depicted in FIG. 19, the electrostatic protection device 100a and an electrostatic discharge device 100f are connected between the high potential power supply VDD and an interface terminal VIF such as the input terminal VIN and the output terminal VOUT that is the terminal to be protected. In this case, the connection is made such that both the first terminal 1a of the electrostatic protection device 100a and a second terminal 2f of the electrostatic discharge device 100f are directed to the high potential power supply VDD side.

Then, the electrostatic protection device 100b and the electrostatic protection diode 120b are connected between the interface terminal VIF and the low potential power supply VSS such that both the second terminal 2b of the electrostatic protection device 100b and the anode of the electrostatic protection diode 120b are directed to the low potential power supply VSS side.

In this case, the number of diodes configuring the electrostatic discharge device 100f may be predetermined in response to the maximum voltage to be applied between the interface terminal VIF and the high potential power supply VDD at the time of hot swap or hot plug.

Figure 9A:
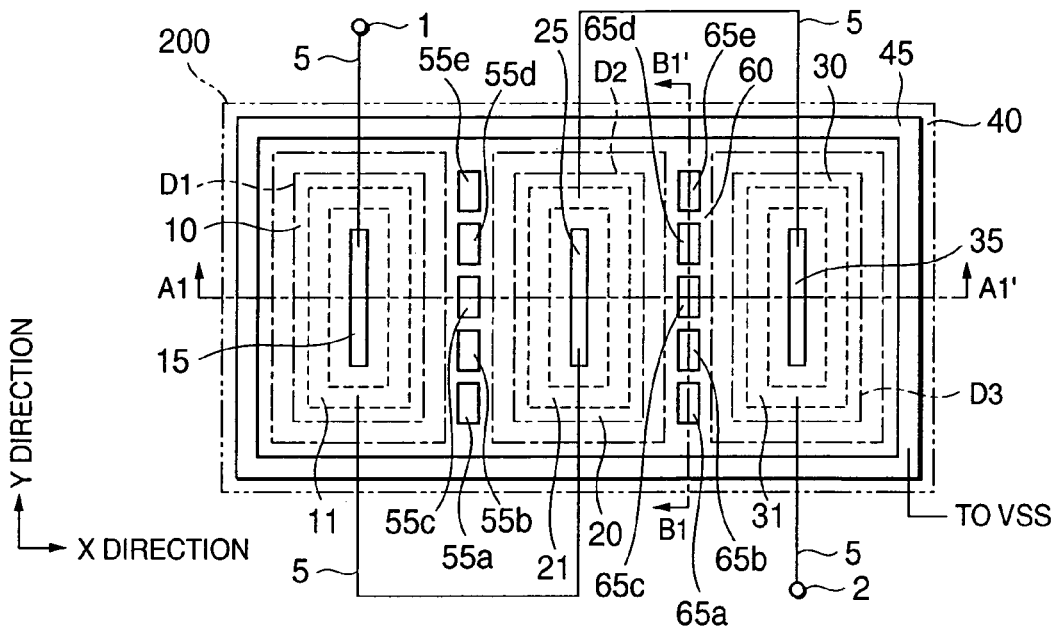
FIG. 9A depicts a schematic plan view of a first embodiment of the electrostatic discharge device of the present invention.
Figure 9B:
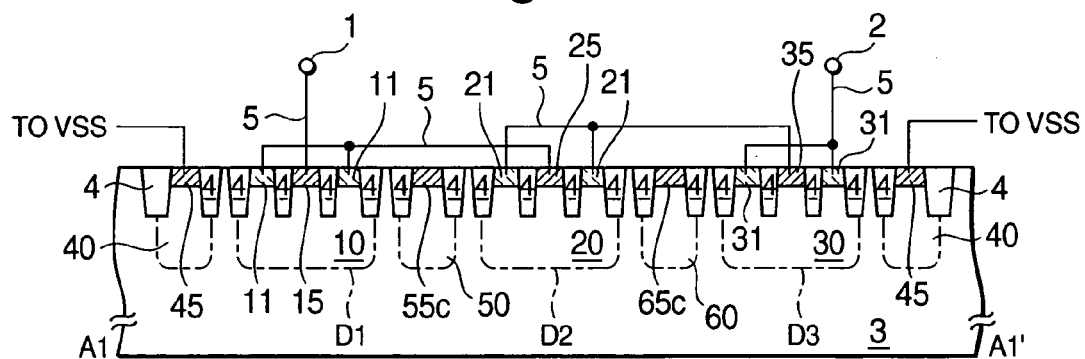
FIGS. 9B and 9C are cross-sectional views schematically depicting cross sections on arrow along lines A1–A1' and B1–B1' in FIG. 9A, respectively.
Figure 9C:
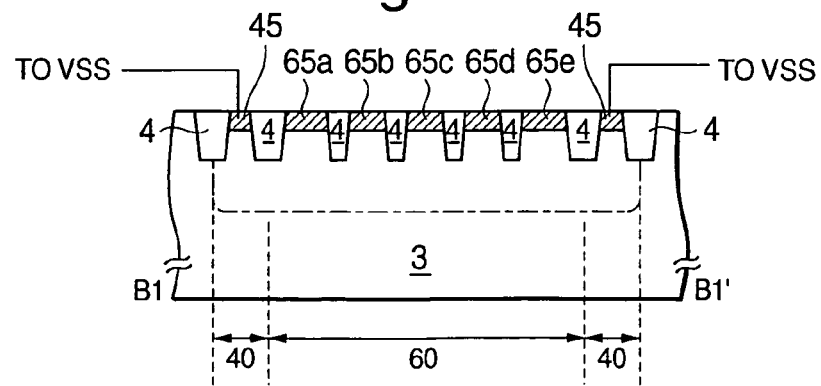

Next, the electrostatic discharge device of the present invention will be described by a more concrete embodiment while taking the case of M=3 as an example. FIGS. 9A to 9C are views for explaining the first embodiment: FIG. 9A is a schematic plan view; and FIGS. 9B and 9C are cross-sectional views schematically depicting cross-sectional views on arrow along lines A1–A1' and B1–B1' in FIG. 9A, respectively.

Referring to FIGS. 9A to 9C, an electrostatic discharge device 200 includes: three n-well regions 10, 20 and 30, all of which are first well regions arranged/formed so as to be spaced from one another along a straight line in the X direction; and p-well regions 50 and 60, both of which are second well regions formed between the n-well regions 10 and 20 adjacent to each other and between the N-well regions 20 and 30 adjacent to each other, respectively.

Furthermore, in the electrostatic discharge device 200, the n-well region 10 includes an n-type diffusion region 11 that is a first diffusion region formed therein, and a p-type diffusion region 15 that is a second diffusion region formed therein. Moreover, in the electrostatic discharge device 200, the n-well region 20 includes an n-type diffusion region 21 that is a first diffusion region formed therein, and a p-type diffusion region 25 that is a second diffusion region formed therein.

Moreover, the electrostatic discharge device 200 includes an n-type diffusion region 31 that is a first diffusion region and a p-type diffusion region 35 that is a second diffusion region, both of which are formed in the n-well region 30. Moreover, in the electrostatic discharge device 200, the p-well region 50 includes therein p-type diffusion regions 55a, 55b, 55c, 55d and 55e (hereinafter, simply referred to as a p-type diffusion region 55 when being generically called) that are third diffusion regions formed as a plurality of regions spaced from one another. Furthermore, in the electrostatic discharge device 200, the p-well region 60 includes therein p-type diffusion regions 65a, 65b, 65c, 65d and 65e (hereinafter, simply referred to as a p-type diffusion region 65 when being generically called) that are third diffusion regions formed as a plurality of regions spaced from one another.

Then, in the electrostatic discharge device 200, what are connected to each other are: the n-type diffusion region 11 and the p-type diffusion region 25; the p-type diffusion region 15 and the first terminal 1; the n-type diffusion region 21 and the p-type diffusion region 35; and the n-type diffusion region 31 and the second terminal 2. All of the connections are made by metal wires 5. Note that it is desirable for the metal wires 5 to be formed of aluminum (Al) or copper (Cu) as a main material. Moreover, if an internal device of the LSI on which this electrostatic discharge device 200 is mounted has a CMOS configuration, impurity concentrations of the p-type diffusion regions 15, 25 and 35, p-type diffusion region 55 and p-type diffusion region 65 are set equal to impurity concentrations of source/drain regions of a pMOSTr. Moreover, impurity concentrations of the n-type diffusion regions 11, 21 and 31 are set equal to impurity concentrations of source/drain regions of an nMOSTr. Furthermore, in the p-type diffusion regions 15, 25 and 35, the p-type diffusion region 55, the p-type diffusion region 65 and the n-type diffusion regions 11, 21 and 31, shallow trench isolation regions 4 which delimit the regions are formed on region boundary portions of the respective ones.

Moreover, no particular limitations are imposed on plan shapes of the n-well regions 10, 20 and 30, the p-well regions 50 and 60, the p-type diffusion regions 15, 25 and 35, the p-type diffusion region 55 and the p-type diffusion region 65. However, each of them has a rectangular shape having a longer side along the Y direction. Furthermore, plan shapes of the n-type diffusion regions 11, 21 and 31 are formed into doughnut shapes in each of which an inside of a first rectangle is hollowed by a second rectangle formed of sides parallel to respective sides of the first rectangle.

Furthermore, this electrostatic discharge device 200 includes a p-well region 40 surrounding all of the three n-well regions 10, 20 and 30 and a p-type diffusion region 45 formed therein. This p-type diffusion region 45 is connected to the lowest potential power supply VSS of the LSI on which the electrostatic discharge device 200 is mounted. Moreover, in the electrostatic discharge device 200, the p-well regions 40, 50 and 60 are integrally formed.

Figure 10B:
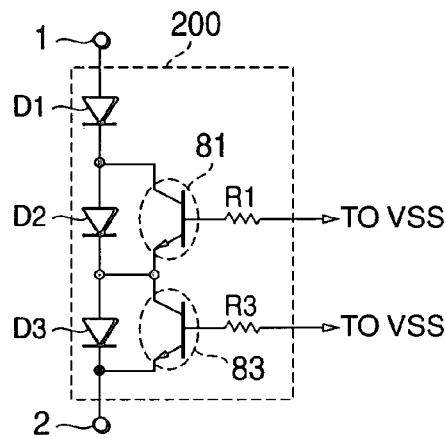
Figure 10C:
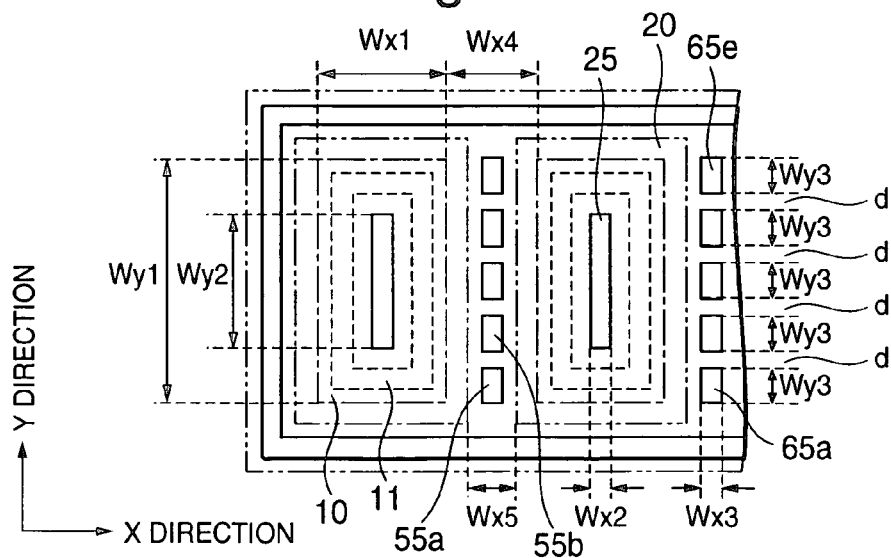
FIG. 10C depicts a schematic plan view of FIGS. 10A and 10B.

Next, a protection operation of this electrostatic discharge device 200 is described. FIGS. 10A to 10C are a diagram depicting an equivalent circuit of the electrostatic discharge device 200 of the first embodiment, and the like, and FIGS. 10A and 10B are a view depicting the cross-sectional view of FIG. 9B, to which schematic parasitic devices are added, and an equivalent circuit diagram including a parasitic effect, respectively.

In the electrostatic discharge device 200, the n-well region 10 and the p-type diffusion region 15 configure the first diode D1, the n-well region 20 and the p-type diffusion region 25 configure the second diode D2, and the n-well region 30 and the p-type diffusion region 35 configure the third diode D3. For these, description will be made below with reference to FIGS. 10A to 10C.

When the ESD stress that makes the first terminal 1 side positive is applied between the first terminal 1 and the second terminal 2, if the voltage exceeds 3×Vf, first, the forward current of the diodes starts to flow from the first terminal 1 to the second terminal 2. Specifically, the current flows individually from the p-type diffusion region 15 to the n-well region 10, from the p-type diffusion region 25 to the n-well region 20, and from the p-type diffusion region 35 to the n-well region 30.

As this current is being increased, a current also comes to flow through a vertical parasitic PNP transistor (hereinafter, referred to a parasitic PNPTr), which is formed of the p-type diffusion region 15, the n-well region 10 and the p-type silicon substrate 3, and through a vertical parasitic PNPTr, which is formed of the p-type diffusion region 25, the n-well region 20 and the p-type silicon substrate 3; and which is formed of the p-type diffusion region 35, the n-well region 30 and the p-type silicon substrate 3.

Then, as the current through these parasitic PNPTrs is being increased, the potentials of the p-well regions 50 and 60 rise. Note that the p-well regions 50 and 60 are corresponding to the base regions formed in a parasitic NPN transistor. That is, the base potentials of the parasitic NPN transistor rise. Consequently, a parasitic NPN transistor (hereinafter, referred to as a parasitic NPNTr) 81 and a parasitic NPNTr 83 come to conduct. Here, the parasitic NPNTr 81 is formed of the n-well region 10, the p-type silicon substrate 3 and the n-well region 20, and the parasitic NPNTr 83 is formed of the n-well region 20, the p-type silicon substrate 3 and the n-well region 30.

Specifically, a current path is configured parallel to the forward current path of the first diode D1, second diode D2 and third diode D3 connected in series, and accordingly, a voltage rise between the first terminal 1 and the second terminal 2 is controlled.

In the electrostatic discharge device 200 of this embodiment, the p-well regions 50 and 60 are formed between the n-well region 10 and the n-well region 20 and between the n-well region 20 and the n-well region 30, respectively. Moreover, the p-type diffusion region 55 is formed in the p-well region 50. Furthermore, the p-type diffusion region 65 is formed in the p-well region 60.

Hence, as compared with the case where the p-type silicon substrate 3 remains as it is between the n-well region 10 and the n-well region 20 and between the n-well region 20 and the n-well region 30, in the electrostatic discharge device 200 of this embodiment, resistance values of resistors R1 and R3 serving as the respective base resistors for the parasitic NPNTr 81 and 83 in the equivalent circuit of FIG. 10B are lowered effectively. That is, a parasitic vertical NPN bipolar transistor which is formed of an emitter 31, a base 30 and a collector 3 operates in an active state. A collector current of the parasitic vertical NPN bipolar transistor flows through the p-type silicon substrate.

As a result, a parasitic lateral NPN bipolar transistor which is formed of an emitter 30, a base 3 and a collector 20 operates in an active state. And the base potentials of the parasitic NPNTr 81 and 83 are more stable. Hence, no latch-up operation is caused by a little noise during the normal operation.

Note that, in this embodiment, an arrangement interval, divided numbers, impurity concentrations and the like of the p-type diffusion regions 55 and 65 are adjusted in response to the limit voltage value and current value of the terminals, to which the electrostatic discharge device 200 is connected.

Next, an outline of a method for manufacturing the electrostatic discharge device 200 will be described.

FIGS. 11A to 11F are cross-sectional views for each process, depicting cross sections for each main process for explaining an example of this manufacturing method. Note that these cross-sectional views for each process are depicted by the cross section on arrow along the line A1–A1' in FIG. 9A.

Figure 1:
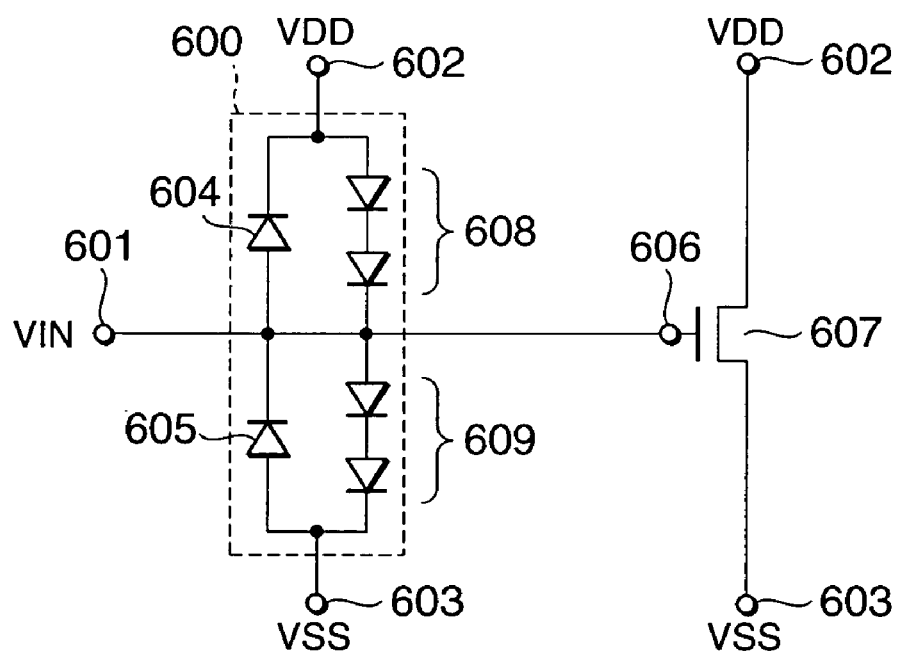
FIG. 1 depicts a circuit diagram of a protection circuit disclosed in Japanese Patent Laid-Open Publication No. S63-81845 (published in 1988).
Figure 2A:
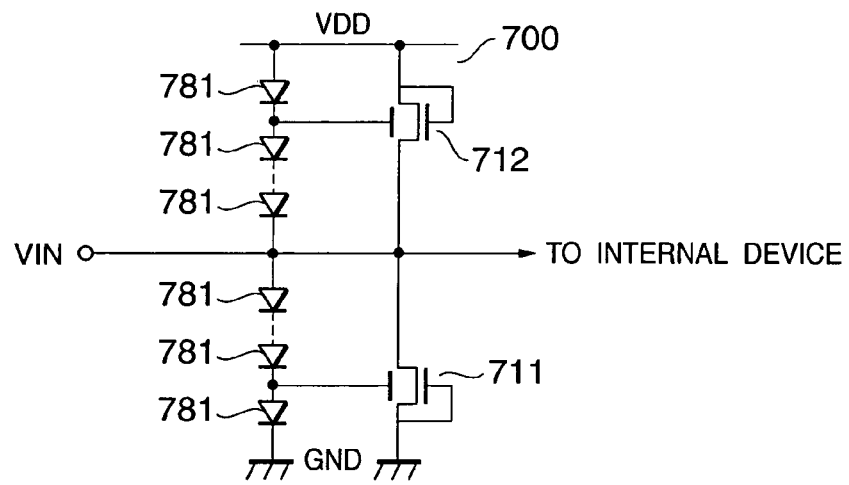
FIG. 2A depicts a circuit diagram of an input protection circuit disclosed in Japanese Patent Laid-Open Publication 2001-148460.
Figure 2B:
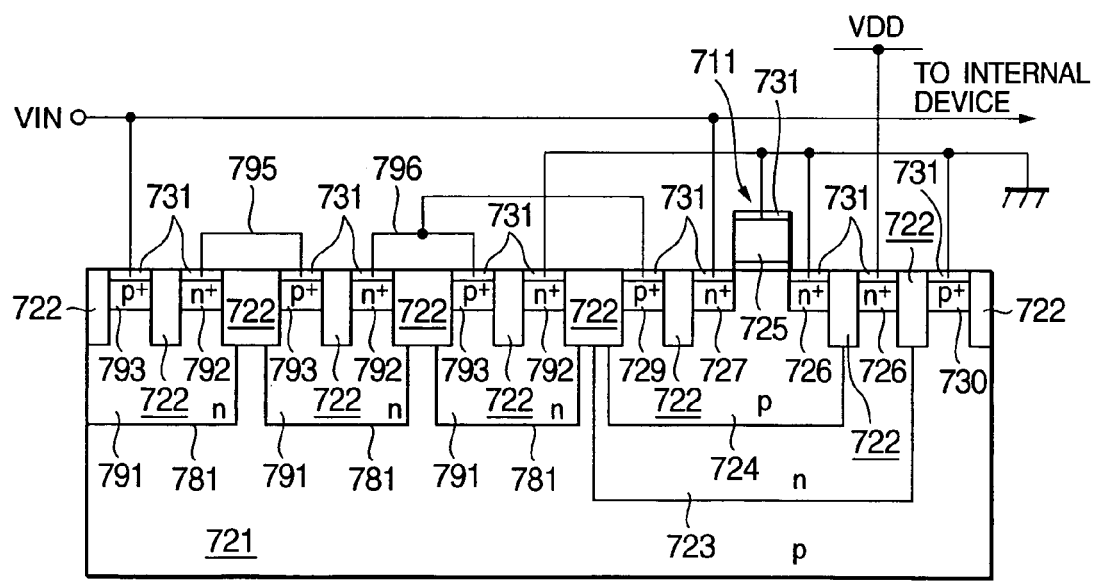
FIG. 2B is a cross-sectional view schematically depicting a cross-sectional structure of the circuit in FIG. 2A.
Figure 3A:
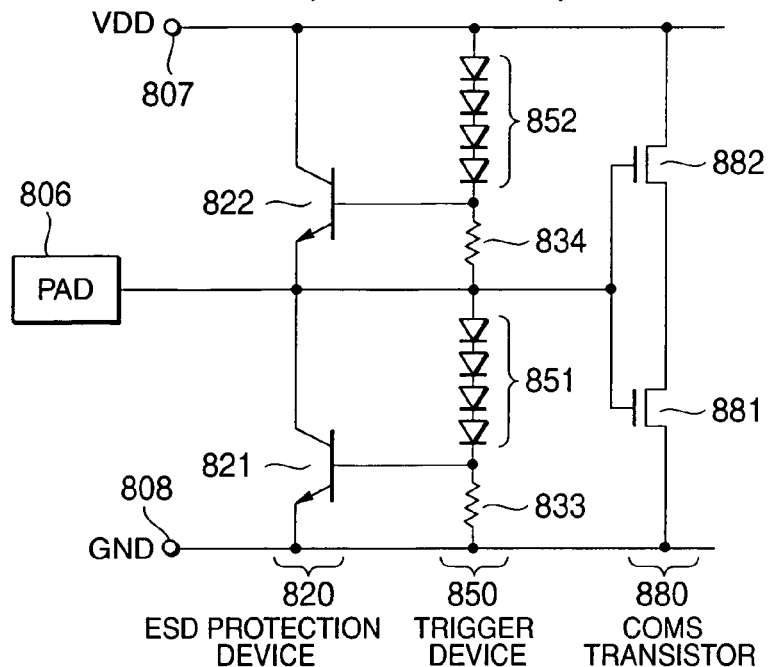
FIG. 3A depicts a circuit diagram of an ESD protection device disclosed in Japanese Patent Laid-Open Publication No. 2002-43533.
Figure 3B:
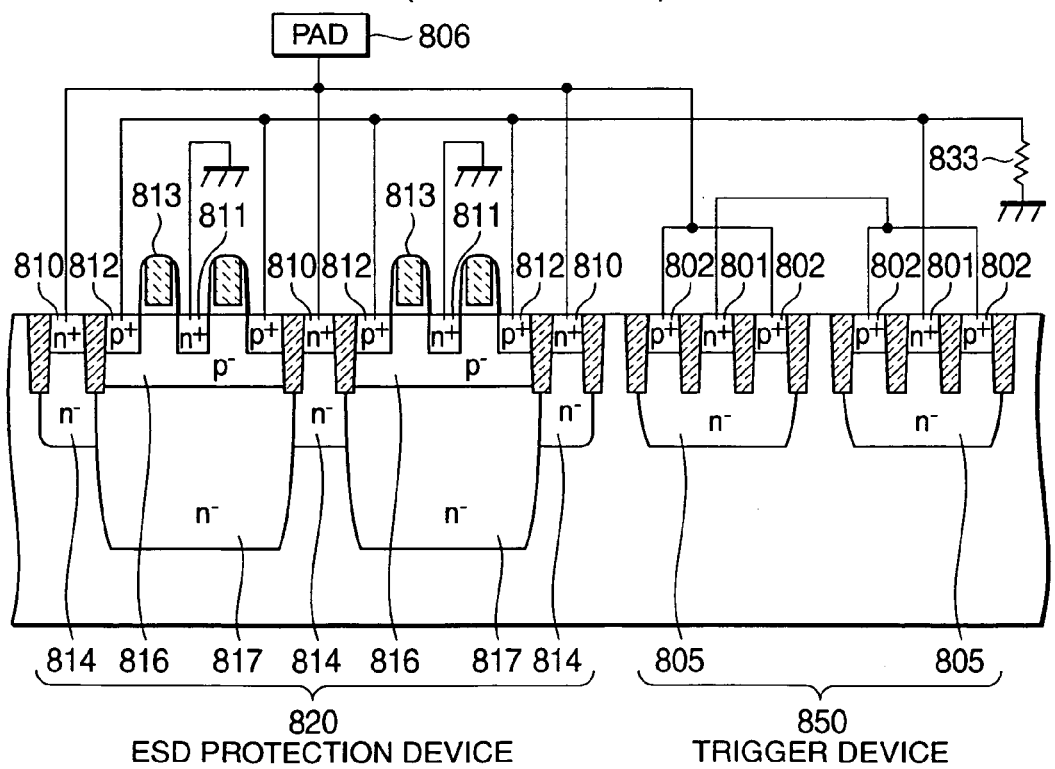
FIG. 3B is a cross-sectional view schematically depicting a cross-sectional structure of the device in FIG. 3A.
Figure 4A:
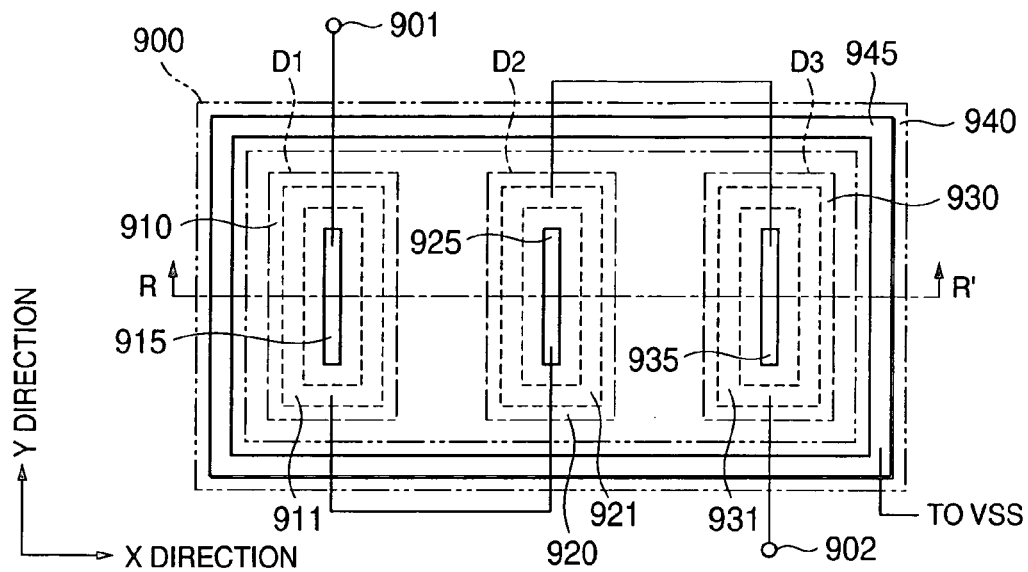
FIG. 4A is a plan view schematically depicting an example where a plurality of diodes configuring a diode group are arranged so as to be proximate to one another.
Figure 4B:
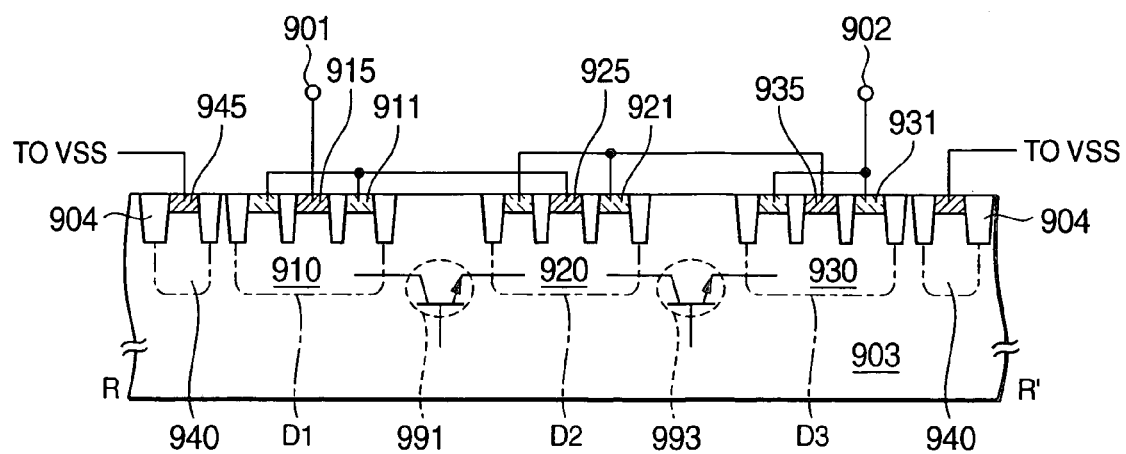
FIG. 4B is a cross-sectional view schematically depicting a cross section on arrow along a line R–R' of FIG. 4A.

Moreover, main sizes of the electrostatic discharge device 200 are depicted in FIG. 1C. Referring to dimension definitions of FIG. 10C, a length Wy1 of the n-well regions 10, 20 and 30 in the Y direction is set equal to 50 μm (Wy1=50 μm), and a length Wy2 of the p-type diffusion regions 15, 25 and 35 in the Y direction is set equal to 40 μm (Wy2=40 μm).

Furthermore, an interval Wx4 between the adjacent n-well regions (an interval between the n-well region 10 and the n-well region 20 and an interval between the n-well region 20 and the n-well region 30) is set equal to 5 μm (Wx4=5 μm). A width Wx5 of the p-well regions 50 and 60 is set equal to 3 μm. Lengths Wx3 and Wy3 of the p-type diffusion regions 55 and 65 in the X direction and the Y direction are set equal to 2 μm and 8 μm, respectively (Wx3=2 μm, Wy3=8 μm).

Furthermore, with regard to the p-type diffusion regions that are units configuring the p-type diffusion regions 55 and 65, namely, the p-type diffusion regions 55a, 55b, 55c, 55d and 55e and the p-type diffusion regions 65a, 65b, 65c, 65d and 65e, an interval d of the p-type diffusion regions adjacent to each other in the Y direction (for example, an interval between the p-type diffusion regions 55a and 55b, an interval between the p-type diffusion region 65c and the p-type diffusion region 65b or 65d, and so on) is set equal to 2.5 μm (d=2.5 μm). However, in the drawings, the respective portions and intervals are depicted under magnification as appropriate irrespective of the above-described dimensions for the sake of facilitating understanding.

Figure 11A:
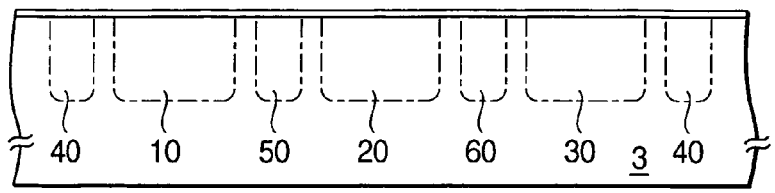
FIGS. 11A to 11F are cross-sectional views for each process, depicting cross sections for each main process for explaining an example of a manufacturing method of the electrostatic discharge device of the first embodiment.

First, the p-type silicon substrate 3 of which specific resistance is approximately 10 Ω·cm is prepared. On predetermined positions on a main surface of this substrate, on which desired circuit devices are formed, the n-well regions 10, 20 and 30, of which impurity concentration is approximately $5 \times 10^{17}$ cm$^{-3}$, and the p-well regions 40, 50 and 60, of which impurity concentration is approximately $5 \times 10^{17}$ cm$^{-3}$, are individually formed, for example, by the ion implantation technology (FIG. 11A).

Figure 11B:
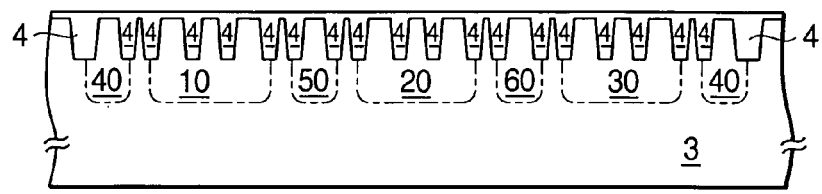

Next, the shallow trench isolation regions 4 which delimit predetermined device regions are formed, for example, by use of the shallow trench isolation technology (FIG. 11B).

Next, a gate insulating film for forming desired internal circuit devices and the like (not depicted) is grown, and for example, polycrystalline silicon or the like serving as gate electrodes is further deposited thereon and patterned, and thus gate regions are formed (either is not depicted).

Figure 11C:
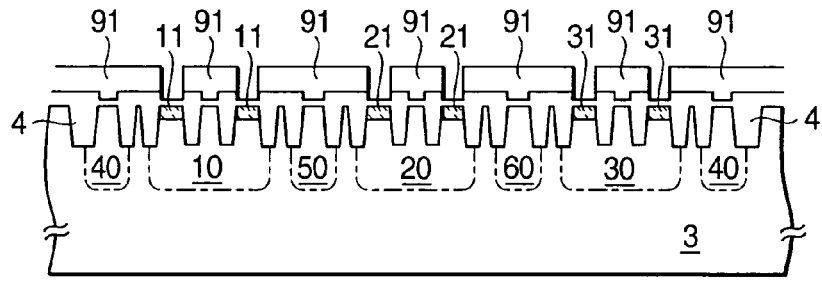

Next, regions other than desired regions are coated with photoresist (hereinafter, referred to as PR) 91 or the like, and arsenic (As), for example, are implanted at an acceleration voltage of 10 keV with a sheet concentration of about $1 \times 10^{15}$/cm$^2$ by the ion implantation technology, thus forming predetermined n-type regions including the n-type diffusion regions 11, 21 and 31 (FIG. 11C)

Figure 11D:
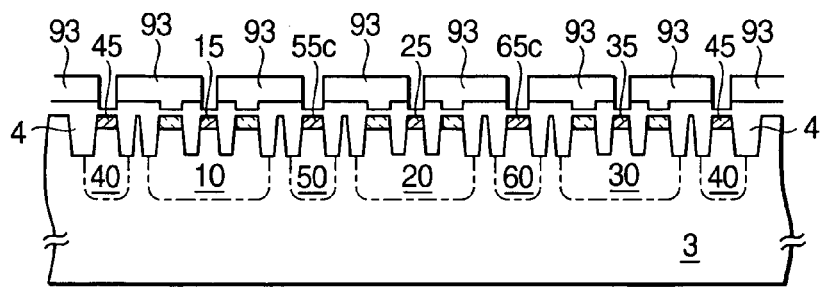

Next, regions other than desired regions are coated with PR 93 or the like, and boron (B), for example, are implanted at an acceleration voltage of approximately 5 keV with a sheet concentration of about $1 \times 10^{15}$/cm$^2$ by the ion implantation technology, thus forming predetermined p-type regions including the p-type diffusion regions 15, 25, 35, 45, 55c and 65c (FIG. 11D).

Figure 11E:
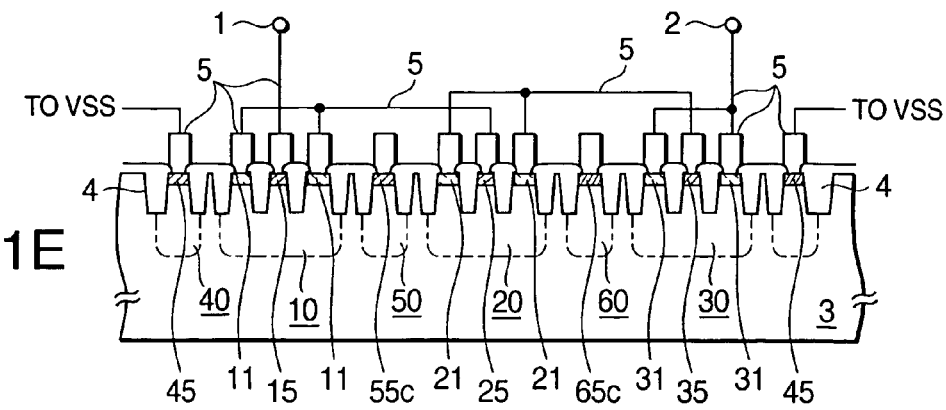
Figure 11F:
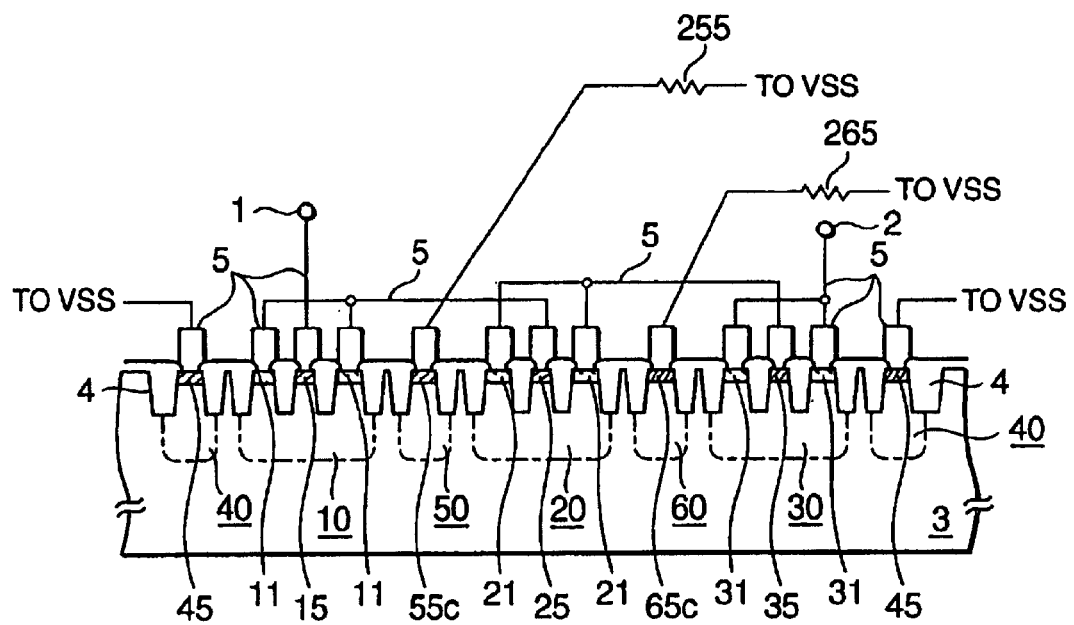

Thereafter, by a publicly known method, contact holes are opened in predetermined regions, and a predetermined wiring material selected from aluminum (Al), copper (Cu), alloys, each of which contains either of the above metals as a main material, and the like is deposited therein and patterned (FIG. 11E). If multilayer wiring is required, it is satisfactory that deposition of an interlayer insulating film, the opening of connection holes, and the deposition and patterning of the wiring material are repeated to form the multilayer wiring. Therefore, description thereof will be omitted. Note that contact holes are opened in the p-type diffusion regions 55c and 65c according to needs, which are then coupled (or connected) to a predetermined power supply (usually, the same power supply as a power supply to which the silicon substrate 3 is connected, or a power supply in which VSS is included) by use of the above-described wiring material (FIG. 11F).

It is supposed that if the p-type diffusion regions (55c, 65c) are not coupled (or connected) to a power supply, the balance of the resistance portion (55a, 55b, 55c, 55d, 55e) in Y-direction resistance can not be obtained, and when the p-type diffusion regions (55c, 65c) are coupled (or connected) to a power supply, the balance of the resistance portion (55a, 55b, 55c, 55d, 55e) in Y-direction resistance can be obtained. Also, the p-type diffusion regions (55c, 65c) are coupled (or connected) to a power supply via a resistance (255, 265).

Note that all of the respective processes described above in the manufacturing method are processes included in a normal manufacturing method of a CMOS LSI. Accordingly, it is unnecessary to add a new process for mounting the electrostatic discharge device 200 on the LSI. It is satisfactory that concrete process conditions, pattern dimensions and the like are set as appropriate in accordance with manufacturing conditions of the LSI on which the electrostatic discharge device 200 is mounted, conditions on the protection operation required for the electrostatic discharge device 200, and the like.

Figure 12A:
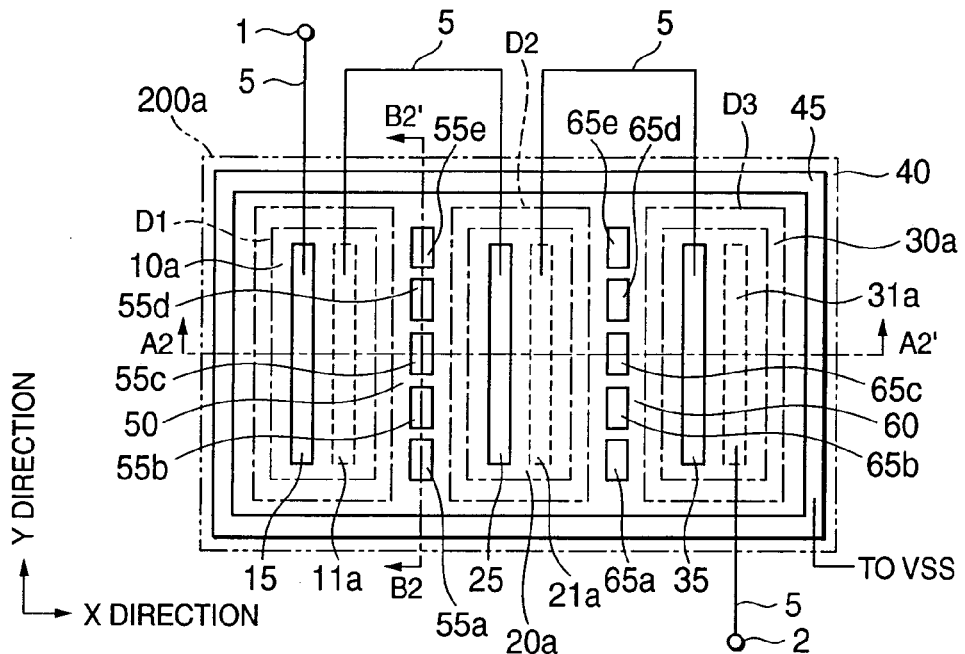
FIG. 12A depicts a schematic plan view for explaining an electrostatic discharge device of a modification example of the first embodiment.
Figure 12B:
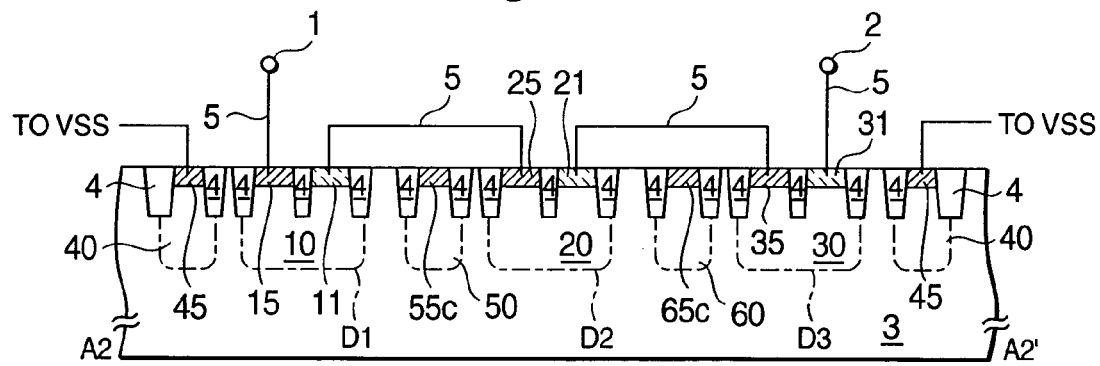
FIGS. 12B and 12C depict schematic cross-sectional views of cross sections on arrow along lines A2–A2' and B2–B2' of FIG. 12A, respectively.
Figure 12C:
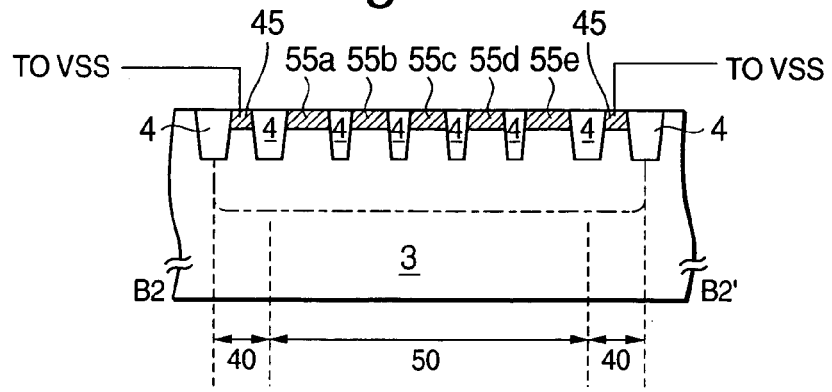

Next, a modification example of the first embodiment will be described. FIGS. 12A to 12C are views for explaining the modification example of the first embodiment. FIG. 12A is a schematic plan view, and FIGS. 12B and 12C are schematic cross-sectional views of cross sections on arrow along lines A2–A2' and B2–B2' of FIG. 12A, respectively.

Referring to FIGS. 12A to 12C, in an electrostatic discharge device 200a of this modification example, three n-well regions 10a, 20a and 30a, all of which are first well regions, are arranged/formed in this order so as to be spaced from one another along a straight line in the X direction. Between the n-well region 10a and the n-well region 20a and between the n-well region 20a and the n-well region 30a, a p-well region 50 and a p-well region 60, both of which are second well regions, are formed, respectively. Furthermore, an n-type diffusion region 11a and a p-type diffusion region 15 are formed in the n-well region 10a. An n-type diffusion region 21a and a p-type diffusion region 25 are formed in the n-well region 20a. An n-type diffusion region 31a and a p-type diffusion region 35 are formed in the n-well region 30a. A p-type diffusion region 55 formed of a plurality of regions spaced from one another is formed in the p-well region 50. A p-type diffusion region 65 formed of a plurality of regions spaced from one another is formed in the p-well region 60. Note that, each pair of the n-type diffusion region 11a and the p-type diffusion region 15, the n-type diffusion region 21a and the p-type diffusion region 25, and the n-type diffusion region 31a and the p-type diffusion region 35 is formed such that one in the pair is opposed to the other in the X direction.

Then, what are connected to each other are: the n-type diffusion region 11a and the p-type diffusion region 25; the p-type diffusion region 15 and the first terminal 1; the n-type diffusion region 21a and the p-type diffusion region 35; and the n-type diffusion region 31a and the second terminal 2. All of the connections are made by the metal wires 5.

As described above, a difference of the electrostatic discharge device 200a of the modification example from the electrostatic discharge device 200 is only the following point. Specifically, in the electrostatic discharge device 200a, each pair of the n-type diffusion region 11a and the p-type diffusion region 15, the n-type diffusion region 21a and the p-type diffusion region 25, and the n-type diffusion region 31a and the p-type diffusion region 35 is formed such that one in the pair is opposed to the other in the X direction. Meanwhile, in the electrostatic discharge device 200, the p-type diffusion regions 15, 25 and 35 are surrounded by the n-type diffusion regions 11, 21 and 31, respectively. All other points than the above, which include a connection relation, an operation, an effect and the like, are the same, and detailed description will be omitted.

Figure 13A:
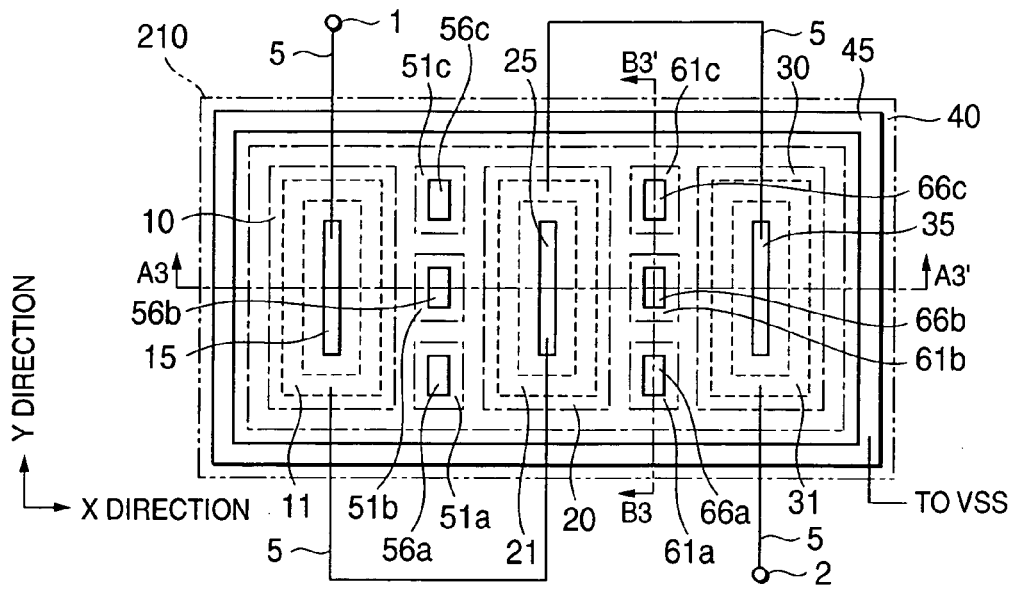
FIG. 13A depicts a schematic plan view for explaining an electrostatic discharge device of a second embodiment.
Figure 13B:
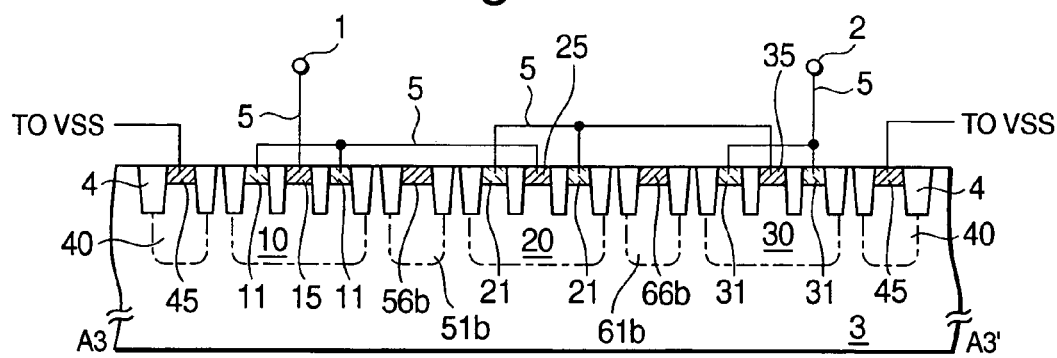
FIGS. 13B and 13C are cross-sectional views schematically depicting cross sections on arrow along lines A3–A3' and B3–B3' in FIG. 13A, respectively.
Figure 13C:
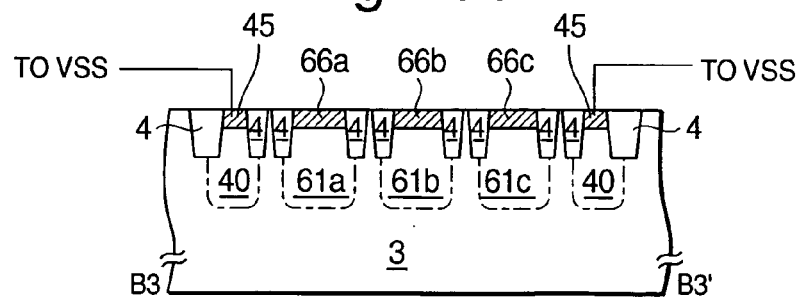

Next, a second embodiment will be described. FIGS. 13A to 13C are views for explaining the second embodiment. FIG. 13A is a schematic plan view, and FIGS. 13B and 13C are cross-sectional views schematically depicting cross sections on arrow along lines A3–A3' and B3–B3', respectively.

Referring to FIGS. 13A to 13C, an electrostatic discharge device 210 of the second embodiment includes: three n-well regions 10, 20 and 30, all of which are first well regions arranged/formed so as to be spaced from one another along a straight line in the X direction; p-well regions 51a, 51b and 51c, which are second well regions formed as a plurality of regions spaced from one another between the n-well region 10 and the n-well region 20 adjacent to each other; and p-well regions 61a, 61b and 61c, which are second well regions formed as a plurality of regions spaced from one another between the n-well region 20 and the n-well region 30.

Furthermore, in the electrostatic discharge device 210 of the second embodiment, the n-well region 10 includes an n-type diffusion region 11 and a p-type diffusion region 15, which are formed therein. The n-well region 20 includes an n-type diffusion region 21 and a p-type diffusion region 25, which are formed therein. The n-well region 30 includes an n-type diffusion region 31 and a p-type diffusion region 35, which are formed therein. The p-well regions 51a, 51b and 51c include p-type diffusion regions 56a, 56b and 56c, which are third diffusion regions formed therein, respectively. The p-well regions 61a, 61b and 61c include p-type diffusion regions 66a, 66b and 66c, which are third diffusion regions formed therein, respectively.

Then, in the electrostatic discharge device 210 of the second embodiment, what are connected to each other are: the n-type diffusion region 11 and the p-type diffusion region 25; the p-type diffusion region 15 and a first terminal 1; the n-type diffusion region 21 and the p-type diffusion region 35; and the n-type diffusion region 31 and a second terminal 2. All of the connections are made by metal wires 5. Note that configurations other than the above are the same as those of the electrostatic discharge device 200. Accordingly, the same reference numerals are added to the same constituents, and detailed description thereof will be omitted.

As described above, the electrostatic discharge device 210 is different from the electrostatic discharge device 200 in the following points. Specifically, between the n-well region 10 and the n-well region 20 and between the n-well region 20 and the n-well region 30, the plurality of p-well regions which are spaced from one another are individually formed, and in each of the p-well regions, the p-type diffusion region that is a single region is formed. The electrostatic discharge device 210 also has similar operation and effect, which include the protection operation when the ESD stress is applied thereto, to those of the case of the electrostatic discharge device 200. Accordingly, description thereof will be omitted.

Figure 14A:
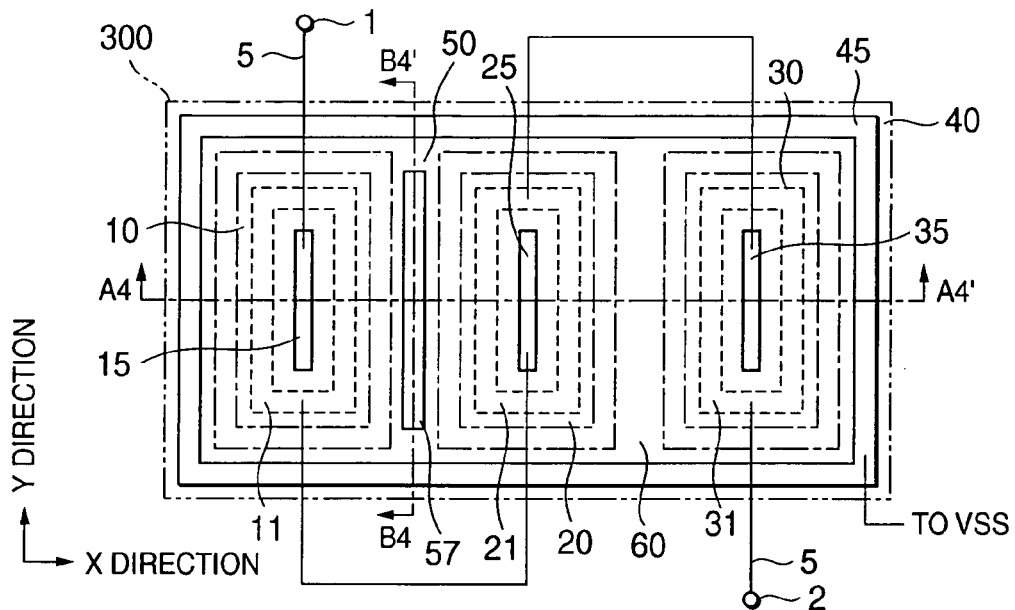
FIG. 14A depicts a schematic plan view for explaining an electrostatic discharge device of a third embodiment.
Figure 14B:
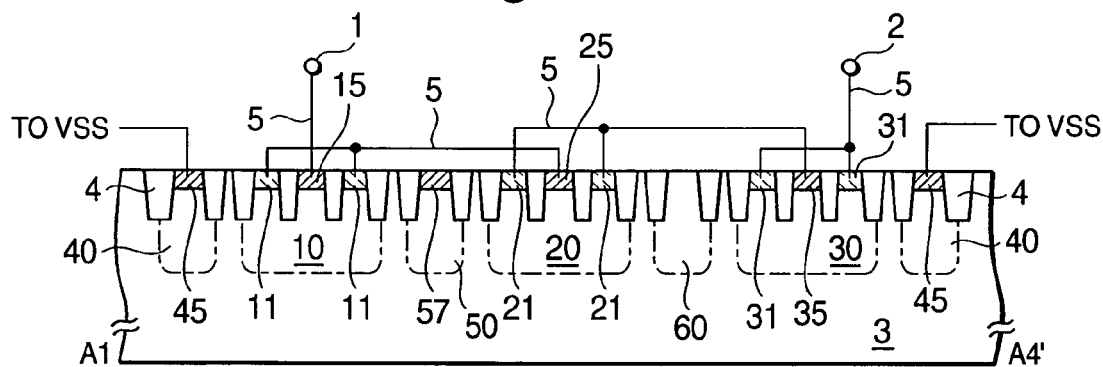
FIGS. 14B and 14C are cross-sectional views schematically depicting cross sections on arrow along lines A4–A4' and B4–B4' in FIG. 14A.
Figure 14C:
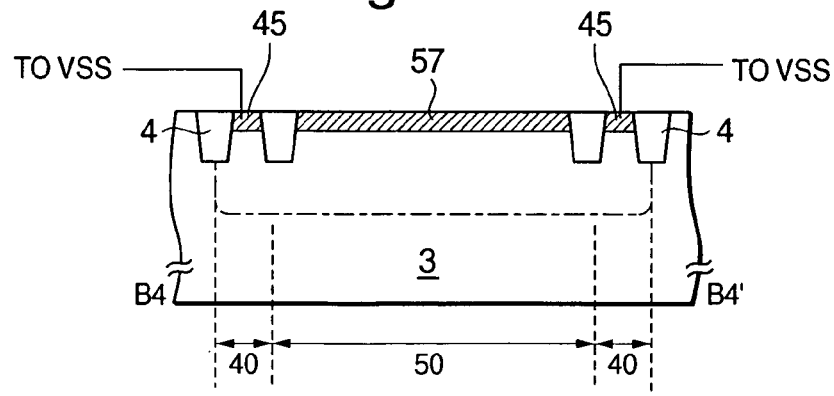

Next, a third embodiment will be described. FIGS. 14A to 14C are views for explaining the third embodiment. FIG. 14A 10 is a schematic plan view, and FIGS. 14B and 14C are cross-sectional views schematically depicting cross sections on arrow along lines A4–A4' and B4–B4' in FIG. 14A, respectively.

Referring to FIGS. 14A to 14C, an electrostatic discharge device 300 of the third embodiment includes: three n-well regions 10, 20 and 30 arranged/formed so as to be spaced from one another along a straight line in the X direction; a p-well region 50 formed between the n-well region 10 and the n-well region 20; and a p-well region 60 formed between the n-well region 20 and the n-well region 30.

Furthermore, in the electrostatic discharge device 300 of the third embodiment, the n-well region 10 includes an n-type diffusion region 11 and a p-type diffusion region 15, which are formed therein. The n-well region 20 includes an n-type diffusion region 21 and a p-type diffusion region 25, which are formed therein. The n-well region 30 includes an n-type diffusion region 31 and a p-type diffusion region 35, which are formed therein.

Moreover, the p-well region 50 provided between the n-well region 10 that is a first well region of which potential is the highest and the n-well region 20 adjacent to this n-well region 10 includes a p-type diffusion region 57 that is a third diffusion region formed therein. However, a p-type diffusion region is not formed in the p-well region 60.

Furthermore, in the electrostatic discharge device 300 of the third embodiment, what are connected to each other are: the n-type diffusion region 11 and the p-type diffusion region 25; the p-type diffusion region 15 and a first terminal 1; the n-type diffusion region 21 and the p-type diffusion region 35; and the n-type diffusion region 31 and a second terminal 2. All the connections are made by metal wires 5. Note that configurations other than the above are the same as those of the electrostatic discharge device 200. Accordingly, the same reference numerals are added to the same constituents, and detailed description thereof will be omitted.

As described above, the electrostatic discharge device 300 is different from the electrostatic discharge device 200 in that the p-type diffusion region 57 that is a single region is only formed in the p-well region 50 provided between the n-well region 10 and the n-well region 20. In such a way, the p-type diffusion region 57 that is a single region is only formed in the p-well region 50, and thus a latch-up of a parasitic NPNTr (not depicted, corresponding to the parasitic NPNTr 81 in FIG. 10A) to which a higher voltage is applied is controlled. In this case, the parasitic NPTTr is formed of the n-well region 10, a p-type silicon substrate 3 and the n-well region 20.

Moreover, in the electrostatic discharge device 300, a parasitic NPNTr (not depicted, corresponding to the parasitic NPNTr 83 in FIG. 10A) formed of the n-well region 20, the p-type silicon substrate 3 and the n-well region 30 becomes easy to conduct. In this electrostatic discharge device 300 also, with regard to the operation and effect, which include the protection operation when the ESD stress is applied thereto, similar operation and effect to those of the case of the electrostatic discharge device 200 are obtained.

As described above, the electrostatic discharge device of the present invention has the configuration in which the predetermined number of diodes are connected in series between the first terminal and the second terminal in the forward direction while the anodes of the diodes are being directed to the first terminal. The respective diodes are formed of the n-well regions that are the first well regions formed so as to be spaced from one another, and of the p-type diffusion regions individually formed in the n-well regions. Furthermore, each of the p-well regions is provided between the n-well regions adjacent to each other, and the plurality of p-type diffusion regions spaced from one another are formed in the p-well region provided between the n-well region serving as the first well region of which potential is the highest and the n-well region adjacent thereto.

Hence, when the ESD stress that makes the first terminal side positive (+) is applied between the first terminal and the second terminal, the parasitic NPNTr formed of the n-well regions adjacent to each other and the p-type diffusion region provided therebetween conducts. Accordingly, the current path formed of the parasitic NPNTr, which is parallel to the path of the current flowing through the diodes connected in series in the forward direction, is formed. Thus, even if the size of each diode is reduced, the voltage rise between the first terminal and the second terminal during the protection operation from the ESD stress is controlled. Meanwhile, during the normal operation, the latch-up between the first terminal and the second terminal is controlled by the p-well region and the p-type diffusion region at least provided in the p-well region adjacent to the n-well region serving as the first well region of which potential is the highest. Hence, the following effect is obtained. Specifically, a device to be protected, of which ESD resistance is small, can be protected from the ESD stress while controlling the stray capacitance added to the terminal to be protected, to which the electrostatic discharge device of the present invention is connected, and controlling the occurrence of the latch-up in the actual using state of the device.

Note that the present invention is not limited to the description of the above-described embodiments and that a variety of alterations are possible within the scope of the gist of the present invention. For example, though the above respective embodiments have been described by taking the example of providing the shallow trench isolation regions 4 between the n-type diffusion regions and the p-type diffusion regions, which are formed in the respective first well regions, a configuration can be adopted, in which the shallow trench isolation regions and the like are not formed between the n-type diffusion regions and the p-type diffusion regions. Specifically, a configuration can be adopted, in which insulating films embedded in the semiconductor substrate in the thickness direction when viewed from positions of the n-type diffusion regions and p-type diffusion regions on the surface of the semiconductor substrate are not formed.

Figure 15A:
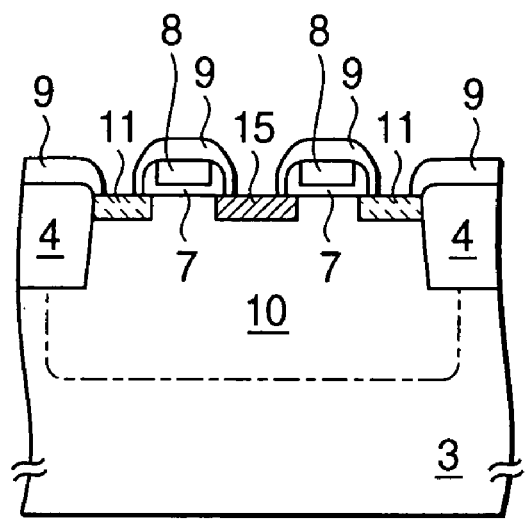
FIG. 15A depicts a schematic cross-sectional view in a case of using a gate portion structure of a MOSTr for explaining a structure example in a case where shallow trench isolation regions are not formed between n-type diffusion regions and p-type diffusion regions in a first well region.
Figure 15B:
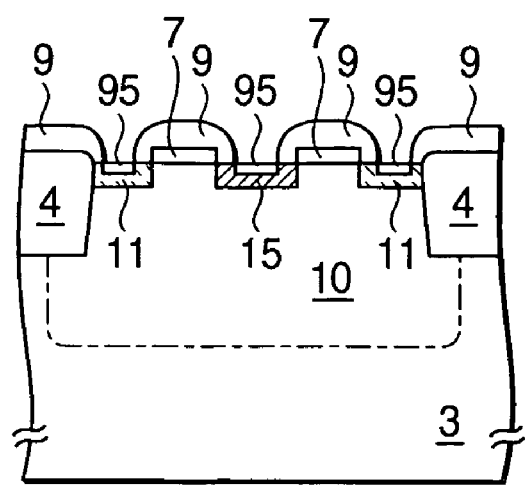
FIG. 15B depicts a schematic cross-sectional view in a case of only forming insulating films on a surface of a semiconductor substrate for explaining a structure example in the case where the shallow trench isolation regions are not formed between the n-type diffusion regions and the p-type diffusion regions in the first well region.
Figure 16A:
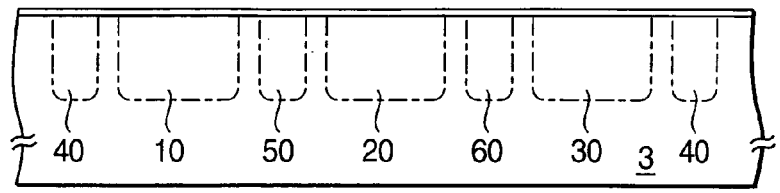
FIGS. 16A to 16E are cross-sectional views for each process, depicting cross sections for each main process of a manufacturing method in a case of using the structure in FIG. 15A.
Figure 16B:
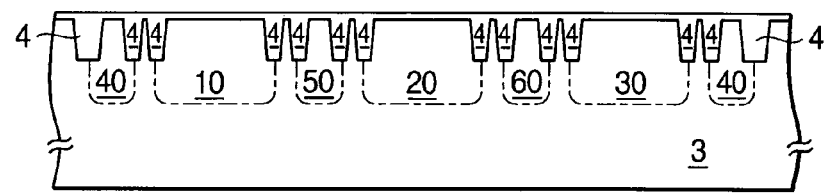
Figure 16C:
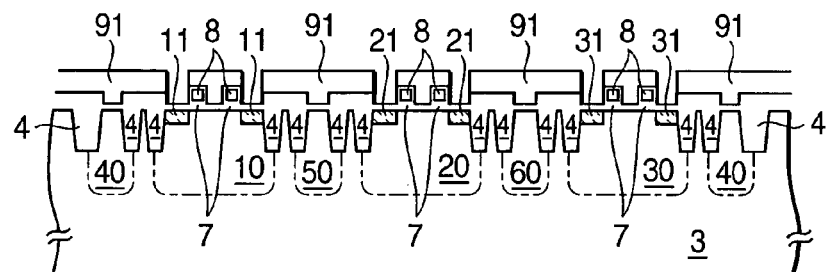
Figure 16D:
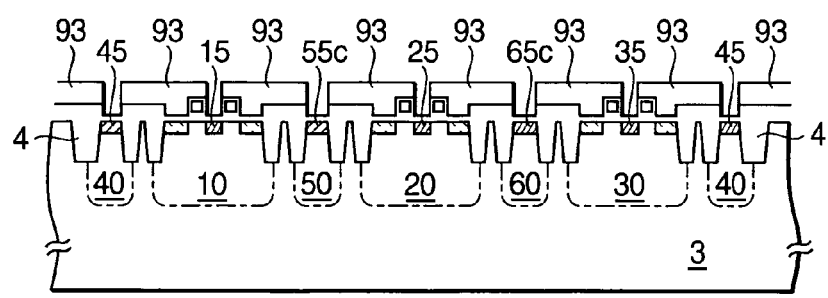
Figure 16E:
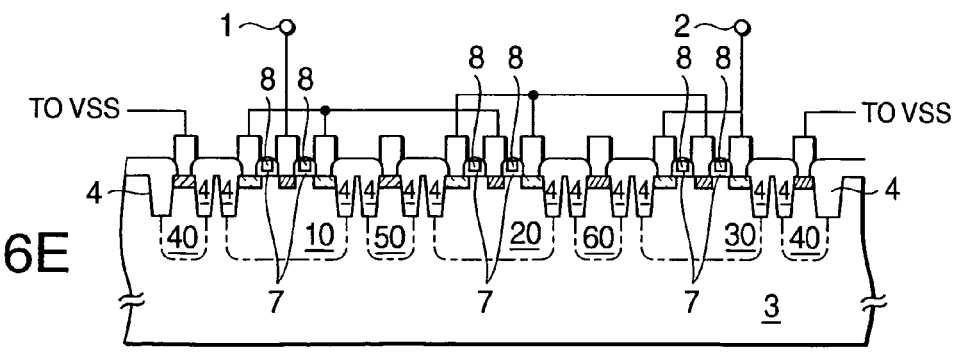

FIGS. 15A and 15B are views depicting, under magnification, only the portions of the n-well regions 10 on the cross section on arrow along the line A1–A1' of FIG. 9A for explaining structure examples when the shallow trench isolation regions are not formed between the n-type diffusion regions and the p-type diffusion regions in the first well region. FIGS. 15A and 15B are schematic cross-sectional views in the case of using a gate portion structure of the MOSTr and the case of only forming insulating films on the surface of the semiconductor substrate, respectively.

In the example depicted in FIG. 15A, the shallow trench isolation regions 4 are not formed between the p-type diffusion region 15 and the n-type diffusion regions 11. In the process of forming the gate insulating film (usually, a silicon oxide film) of the MOSTr that is the internal device of the LSI on which the electrostatic discharge device of the present invention is, mounted, the same gate insulating films 7 as the above are formed simultaneously therewith. Furthermore, in the process of forming the gate electrode of the MOSTr, gate electrode material films 8 formed of the same gate electrode material as that of the above are formed. On the gate electrode material films 8, interlayer insulating films (usually, silicon insulating films such as silicon oxide films and silicon nitride films and multilayer films thereof) 9 are deposited. Note that other wires and the like are not connected to the gate electrode material films 8, and the gate electrode material films 8 remain floating.

FIGS. 16A to 16E are cross-sectional views for each process, depicting cross sections for each main process of a manufacturing method in the case of using the structure in FIG. 15A. Note that, similarly to FIGS. 11A to 11E, these cross-sectional views are also illustrated by using the cross sections on arrow along the line A1–A1' in FIG. 9A. In this case, it is sufficient that the mask pattern for forming the shallow trench isolation regions and the gate electrodes is only changed, and other than this point, this manufacturing method becomes entirely the same as the manufacturing method in the example in FIGS. 11A to 11E. Therefore, detailed description will be omitted.

Moreover, in the example depicted in FIG. 15B, a configuration is made, in which the gate insulating films 7 and the interlayer insulating films 9 are stacked on the surface of the p-type silicon substrate 3 between the n-type diffusion regions 11 and the p-type diffusion regions 15. In this case also, similarly to the case in FIG. 15A, it is sufficient that the mask pattern for forming the shallow trench isolation regions and the gate electrodes is only changed. Note that, as in FIG. 15B, silicide portions 95 may be formed on contact portions of the respective diffusion regions to reduce a contact resistance.

As in the examples depicted in FIGS. 15A and 15B, the configurations are adopted, in which the shallow trench isolation regions are removed from between the n-type diffusion regions and the p-type diffusion regions, which are formed in the first well regions. Thus, forward resistances in high current regions of the respective diodes can be lowered.

Moreover, in the respective embodiments described above, among the plurality of n-well regions arranged along the straight line, the n-well region arranged on the end of the electrostatic discharge device is set as the n-well region 10 or the n-well region 10a serving as the first well region of which potential is the highest. However, other first well regions can be arranged on both sides of the first well region of which potential is the highest.

FIGS. 17A, 17B, 18A and 18B are schematic plan views, each of which depicts the case of M=3, where the n-well region 10 serving as a first well region of which potential is the highest is arranged on the center, the n-well region 20 and the n-well region 30 are arranged on both sides thereof in the X direction, and p-well regions that are second well regions and p-type diffusion regions that are third diffusion regions are arranged between the n-well region 10 and the n-well region 20 and between the n-well region 10 and the n-well region 30, respectively. Note that, in these drawings, the same reference numerals will be added to the same constituents as those in the respective embodiments described above, and description thereof will be omitted.

Figure 17A:
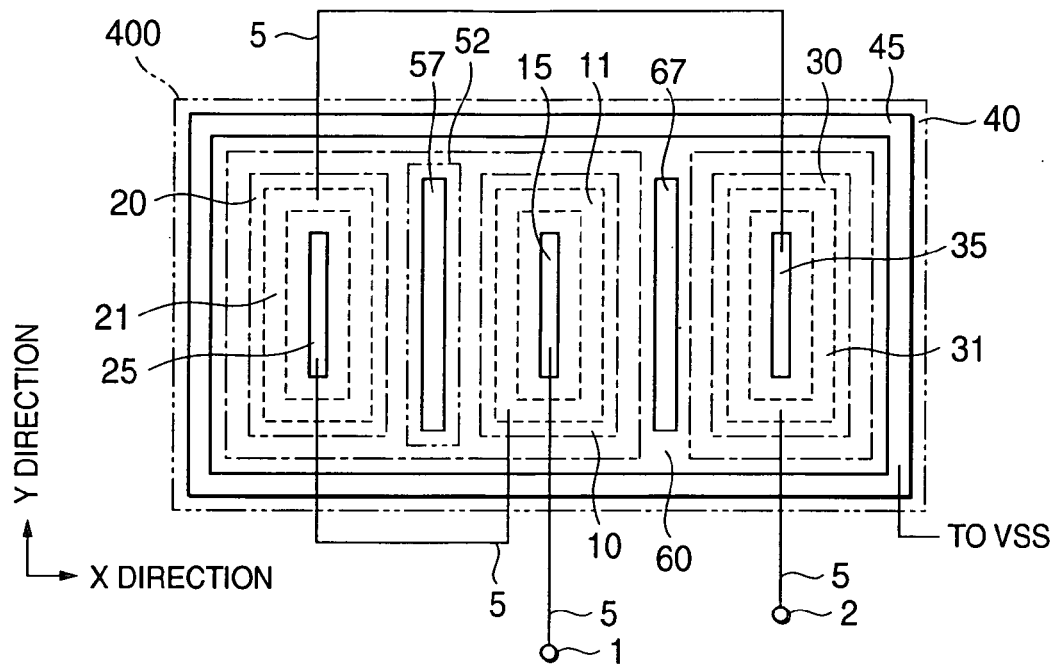
FIGS. 17A and 17B are schematic plan views, each of which depicts a case of M=3, where an n-well region serving as a first well region of which potential is the highest is arranged on the center, and n-well regions are arranged on both sides thereof in an X direction.

FIG. 17A depicts an example where an isolated p-well region 52 that is a single region is arranged between the n-well region 10 and the n-well region 20 and the p-type diffusion region 57 that is a single region is arranged therein, the single p-well region 60 is arranged between the n-well region 10 and the n-well region 30 and a p-type diffusion region 67 that is a single region is arranged therein, and the p-well region 60 is formed integrally with the p-well region 40 surrounding all of the n-well regions 10, 20 and 30.

Figure 17B:
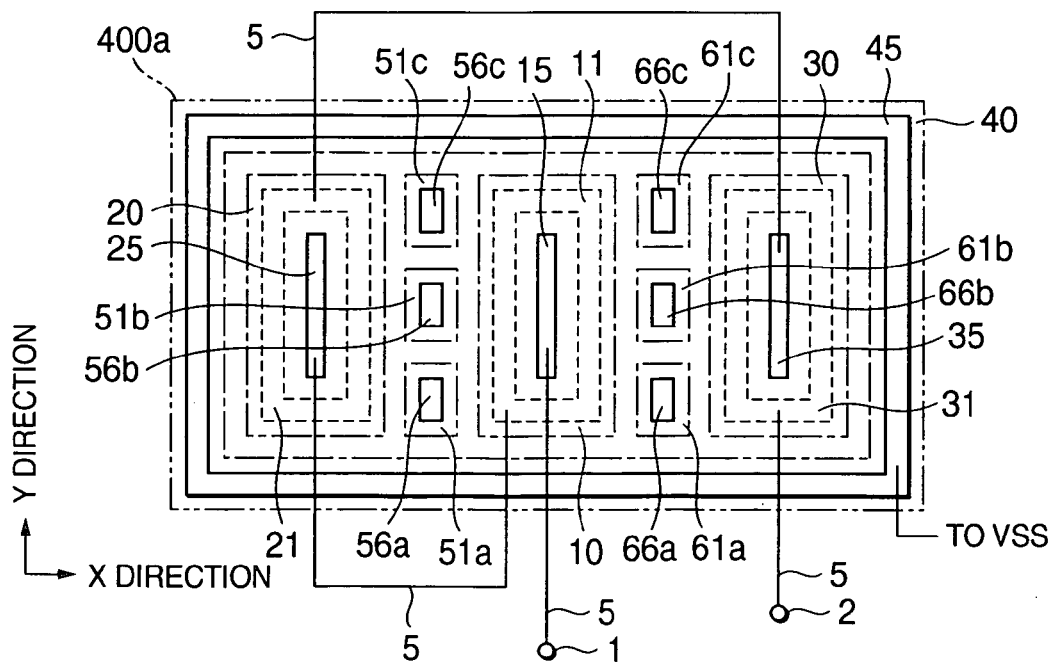

Moreover, FIG. 17B depicts an example where the p-well regions 51a, 51b and 51c are arranged between the n-well region 10 and the n-well region 20, the p-well regions 61a, 61b and 61c are arranged between the n-well region 10 and the n-well region 30, the p-type diffusion regions 56a, 56b and 56c are arranged in the p-well regions 51a, 56b and 56c, respectively, and the p-type diffusion regions 66a, 66b and 66c are arranged in the p-well regions 61a, 61b and 61c, respectively.

Figure 18A:
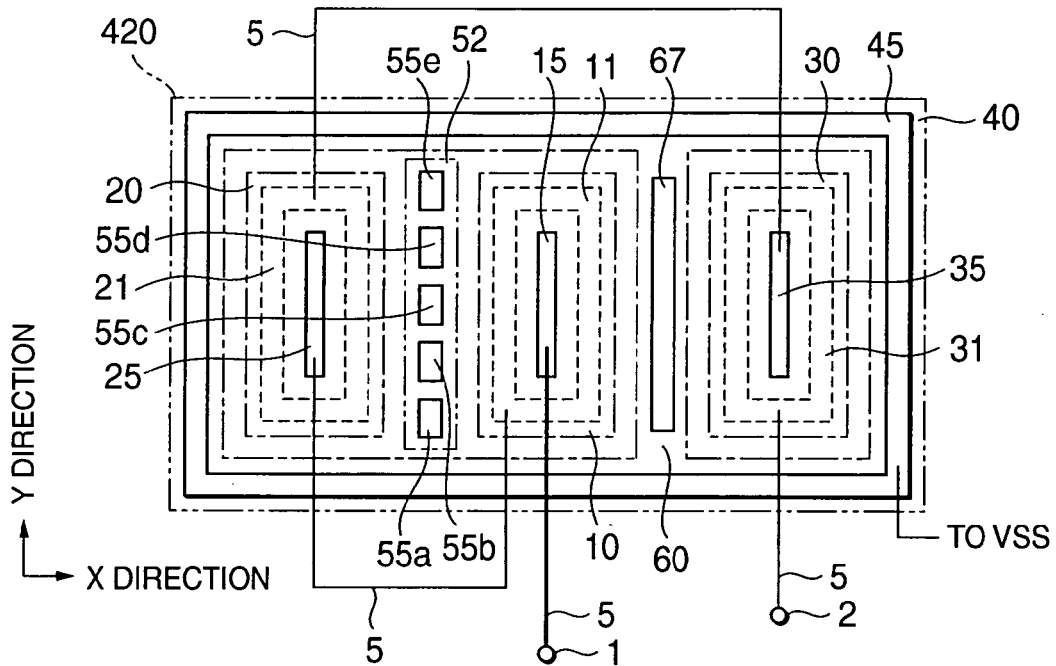
FIGS. 18A and 18B are schematic plan views, each of which depicts the case of M=3, where the n-well region serving as the first well region of which potential is the highest is arranged on the center, and the n-well regions are arranged on both sides thereof in the X direction.
Figure 18B:
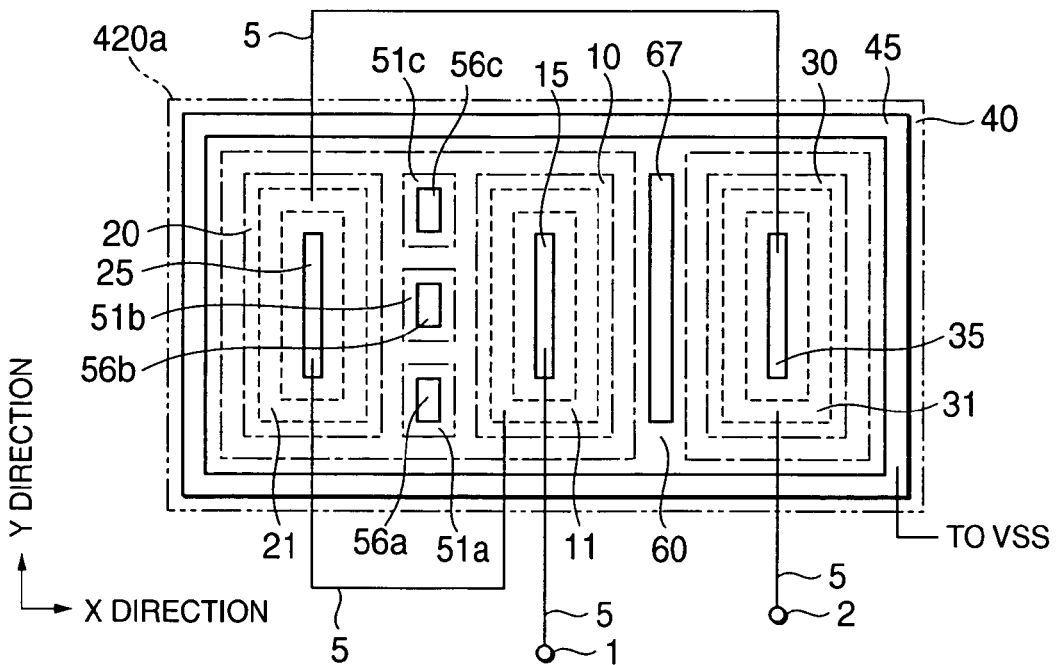

An example in FIG. 18A has substantially the same configuration as that of the example in FIG. 17A. However, FIG. 18A is different from FIG. 17A in that the third diffusion region arranged/formed in the p-well region 52 is formed of the plurality of p-type diffusion regions 55a, 55b, 55c, 55d and 55e. Moreover, an example in FIG. 18B has the same configuration as that of the example of FIG. 17A except that the plurality of p-well regions 51a, 51b and 51c are arranged and the p-type diffusion regions 56a, 56b and 56c are arranged therein respectively in place of the p-well region 52 and the p-type diffusion region 57 arranged between the n-well region 10 and the n-well region 20 in the example of FIG. 17A.

Note that, like the p-type diffusion region 57 and the p-type diffusion region 67, when the third diffusion region is formed as a single region in the single second well region, the effect and latch-up resistance of the parasitic NPNTr can be adjusted by adjusting the size of the contact holes and the number thereof.

In the configurations of the electrostatic discharge devices depicted in FIGS. 17A, 17B, 18A and 18B, the connection wiring in each of the electrostatic discharge devices becomes somewhat complicated. However, when the ESD stress is applied to the first terminal 1, the path of the current flowing through the parasitic NPNTr formed of the n-well region 10, the n-well region 30 and the p-type silicon substrate 3 is configured as well as the forward current path of the diodes and the path of the current flowing through the parasitic NPNTr formed of the n-well region 10, the n-well region 20 and the p-type silicon substrate 3. Therefore, the voltage rise between the first terminal 1 and the second terminal 2 due to the ESD stress can be controlled more.

Note that the shapes of the second well region and third diffusion region, for example, the number of regions, and the size of the regions, the interval therebetween and the like when the plurality of regions are set are not limited to the above-described embodiments, and may satisfactorily be set as appropriate based on the desired ESD resistance of the device to be protected by this electrostatic discharge device, the desired latch-up resistance between the first terminal 1 and the second terminal 2, and the like. In this case, even in one electrostatic discharge device, the shapes of the second well region and the third diffusion region maybe varied in accordance with the locations thereof as in the examples in FIGS. 17A, 18A and 18B.

As described above, the following effects are obtained by use of the electrostatic discharge device of the present invention. The protection operation is enabled at a low voltage, the stray capacitance to be added to the device can be controlled, and the occurrence of the latch-up can be controlled in the actual using state, thus making it possible to protect the device to be protected, of which ESD resistance is small, from the ESD stress. Hence, in an LSI for which an ultra-high speed operation is required at input/output units, for example, the device of which ESD resistance is small is directly connected to an external terminal and the stray capacitance added to the terminal must be controlled as much as possible in many cases. However, the desired LSI can be realized easily even in such a case, by applying the electrostatic discharge device of the present invention to the terminal.

It is apparent that the present invention is not limited to the above embodiments, but may be modified and changed without departing from the scope and spirit of the invention.

What is claimed is:

1. An electrostatic discharge device comprising:
a semiconductor substrate of a first conduction type;
first and second wells of a second conduction type opposite to said first conduction type, each of said first and second wells including a first diffusion region of said first conduction type and a second diffusion region of said second conduction type, said second diffusion region in said first well being connected to said first diffusion region in said second well; and
a third well of said first conduction type located between said first well and said second well, wherein said first, second and third wells cooperate with one another to perform a bipolar action;
a fourth well of said second conduction type including a first diffusion region of said first conduction type and a second diffusion region of said second conduction type, said first diffusion region in said fourth well being connected to said second diffusion region in said second well; and
a fifth well of said first conduction type located between said second well and said fourth well, wherein a voltage applied to said first diffusion region of said first well is higher than a voltage applied to said second diffusion region of said fourth well, and wherein said fifth well is free from a diffusion region of said first conductive type therein.

2. The electrostatic discharge device according to claim 1, wherein said second, fourth and fifth well cooperate with one another to perform a bipolar action.

3. An electrostatic discharge device, comprising:
a semiconductor substrate of a first conduction type;
first and second wells of a second conduction type opposite to said first conduction type, each of said first and second wells including a first diffusion region of said first conduction type and a second diffusion region of said second conduction type, said second diffusion region in said first well being connected to said first diffusion region in said second well; and
a third well of said first conduction type formed between said first well and said second well and including a diffusion region of said first conduction type, wherein said diffusion region in said third well is divided into a plurality of portions, each of said portions being apart from each other.

4. The electrostatic discharge device according to claim 3, wherein said diffusion region in said third well is exposed in a surface of said semiconductor substrate.

5. The electrostatic discharge device according to claim 3, wherein said first, second and third wells cooperate with one another to perform a bipolar action.

6. The electrostatic discharge device according to claim 3, further comprising:
a fourth well of said second conduction type including a first diffusion region of said first conduction type and a second diffusion region of said second conduction type, said first diffusion region in said fourth well being connected to said second diffusion region in said second well; and
a fifth well of said first conduction type located between said second well and said fourth well, wherein a voltage applied to said first diffusion region of said first well is higher than a voltage applied to said second diffusion region of said fourth well, and wherein said fifth well is free from a diffusion region of said first conductive type therein.

7. The electrostatic discharge device according to claim 6, wherein said second, fourth and fifth well cooperate with one another to perform a bipolar action.

8. The electrostatic discharge device according to claim 3, wherein said first and second wells are separated from said third well by shallow trench isolation.

* * * * *